(12) United States Patent
Urano

(10) Patent No.: US 8,573,800 B2
(45) Date of Patent: Nov. 5, 2013

(54) LIGHTING APPARATUS

(75) Inventor: Yoji Urano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/522,641

(22) PCT Filed: Jan. 19, 2011

(86) PCT No.: PCT/JP2011/050872
§ 371 (c)(1),
(2), (4) Date: Jul. 17, 2012

(87) PCT Pub. No.: WO2011/090073
PCT Pub. Date: Jul. 28, 2011

(65) Prior Publication Data
US 2012/0287602 A1 Nov. 15, 2012

(30) Foreign Application Priority Data
Jan. 19, 2010 (JP) .................................. 2010-009403

(51) Int. Cl.
F21V 21/00 (2006.01)
F21V 7/04 (2006.01)
F21S 4/00 (2006.01)
F21V 21/02 (2006.01)

(52) U.S. Cl.
USPC ................. 362/218; 362/217.05; 362/217.16; 362/249.02

(58) Field of Classification Search
USPC ...................... 313/45, 46; 362/147, 148, 150, 362/217.1–217.17, 218, 225, 249.02
See application file for complete search history.

(56) References Cited

U.S. PATENT DOCUMENTS 7,918,580 B2 * 4/2011 Liu ............................... 362/218

FOREIGN PATENT DOCUMENTS

JP 2009-158533 7/2009
JP 2009-272072 11/2009

* cited by examiner

Primary Examiner — Nimeshkumar Patel
Assistant Examiner — Steven Horikoshi
(74) Attorney, Agent, or Firm — Greenblum & Bernstein, P.L.C.

(57) ABSTRACT

A lighting apparatus comprising: an elongated-shaped LED unit provided with a plurality of lighting units on one surface in the thickness direction thereof, each of said lighting units having a LED chip; a reflective plate held by a main body; a lighting device for lighting the LED unit; and a heat radiation block to which said LED unit being replaceably attached, configured to dissipate the heat generated in the LED unit, and arranged at the other surface side in the thickness direction of the LED unit. The reflective plate has an installation portion for installing the LED unit. The heat radiation block is held by the reflective plate. The LED unit has a flat portion at light extracting surface from the lighting unit. The flat portion has the same plane with a surrounding area of the installation portion in a reflective surface of the reflective plate.

17 Claims, 13 Drawing Sheets

A

B

A

B

A

B

LIGHTING APPARATUS

TECHNICAL FIELD

This invention relates to a lighting apparatus comprising a plurality of lighting units each have an LED chip.

BACKGROUND ART

Conventionally, a straight type LED lamp is proposed to use instead of a straight tube fluorescent lamp, the straight tube fluorescent lamp being attached to a lighting apparatus installed in a ceiling and used as a generic illumination lamp. The straight type LED lamp includes a plurality of lighting units which have LED chips and which are arranged linearly. (For example, refer to patent literature 1 explained below.)

The LED lamp 200*dd* disclosed in the patent literature 1 includes, as shown in FIG. 16, a pipe 201*dd* having a tubular shape, a substrate 204*dd* having an elongated shape and being arranged in the pipe 201*dd*, and lighting units 1*dd* having the LED chips 10*dd* longitudinally arranged on one surface of the substrate 204*dd*. In addition, in order to release the heat generated in this LED unit 202*dd*, the heat radiation member 205*dd* is disposed within the pipe 201*dd* in the LED lamp 200*dd*.

The substrate 204*dd* is composed of a double-sided printed-wiring board made of glass epoxy resin. The heat radiation member 205*dd* is made of aluminum. In addition, the LED chip 10*dd* of the lighting unit 1*dd* is realized by a blue LED chip configured to emit the blue light. The package 11*dd* made of resin is mixed with the phosphor (not shown in the figures) which is excited by the blue light from the LED chip 10*dd* to emit the yellow light.

CITATION LIST

Patent Literature

PATENT LITERATURE 1: JAPANESE PATENT APPLICATION PUBLICATION No. 2009-272072A. (In paragraph [0012] to [0028], and FIGS. 1, 2)

SUMMARY OF INVENTION

Technical Problem

Although the LED lamp 200*dd* in FIG. 16 includes the heat radiation member 205*dd* within the pipe 201*dd* for releasing the heat in the lighting unit 1*dd*, the heat radiation member 205*dd* is limited its size due to the limitation of the lamp weight adapted to the lighting apparatus. The size limitation of the heat radiation member 205*dd* results in an insufficient heat radiation property. Owing to the size limitation of the heat radiation member 205*dd*, even if the lighting unit 1*dd* having a high brightness is used, there is a need to prevent the temperature of the lighting unit 1*dd* from rising over the permissive temperature of the lighting unit 1*dd*. (For example, there is a need to prevent the temperature of the lighting unit from rising over the maximum junction temperature of the LED chip 10*dd*.) According to this reason, there is a need to limit the input power supplied to the LED chip 10*dd*. Due to the limitation of the input power, it is difficult to increase the light output. In addition, the LED lamp 200*dd* shown in FIG. 16 needs to employ the heat radiation member 205*dd*. The heat radiation member 205*dd* causes the increase of the cost of the LED lamp 200*dd*.

In addition, when attaching the LED lamp to the conventional lighting apparatus for the straight tube fluorescent lamp, there is a need to perform a construction of bypassing the ballast for lighting the straight tube fluorescent lamp. The construction prohibits the spreading of the LED lamp. In addition, the straight tube fluorescent lamp is different in the light distribution from the LED lamp. That is, the lighting environment illuminated by the lighting apparatus is changed. As a result, it is impossible to obtain the room with sufficient brightness, compared with a case where the lighting apparatus with the straight tube fluorescent lamp is used. Therefore, atmosphere in the room is changed. Namely, when the LED lamp is turned on, the area, around the LED lamp, of the reflective plate of the lighting apparatus is shaded. On account of this, it is impossible to give the performance of the illumination. (That is, if the LED lamp is used instead of the straight tube fluorescent lamp, the light distribution performance of the lighting apparatus is changed.) In addition, the lighting unit of the LED lamp emits the light to the lower direction with high directionality. Therefore, the lighting unit is apt to create the shade at the area to be illuminated due to an object between the lighting apparatus and the area to be illuminated.

In view of this, it is proposed a lighting apparatus comprising an LED lamp which is so-called a straight tube fluorescent lamp type LED lamp and a lighting fixture adapted to the LED lamp.

However, also in such the lighting apparatus, the heat radiation property of the LED lamp is limited by the lamp weight limitation of the LED lamp. Therefore, there is a problem that it is difficult to increase the light output of the lighting apparatus.

This invention is produced in view of the above problem. An object of this invention is to produce the lighting apparatus having the LED chip which is increased its light output by preventing the temperature increase of the LED chip. In addition, an object is to prevent the shade in the area around the lighting unit.

Means for Solve the Problems

A lighting apparatus of this invention comprising: an LED unit formed in an elongated shape, said LED unit being provided with a plurality of lighting units on one surface in the thickness direction thereof, each of said lighting units having a LED chip; a main body; a reflective plate made of metal and configured to control the light from said LED unit to be an intended distribution, said reflective plate being held by said main body; a lighting device configured to light said LED unit, said lighting device being replaceably attached to said main body; and a heat radiation block to which said LED unit being replaceably attached and configured to dissipate the heat generated in said LED unit, said heat radiation block being arranged at the other surface side in the thickness direction of said LED unit, wherein said reflective plate has an installation portion for installing said LED unit, said installation portion being formed to be opened in a shape corresponding to the outer circumference shape of said LED unit, said heat radiation block is held by said reflective plate, said LED unit has a flat portion at its light extracting surface from said lighting unit, and said flat portion is in the same plane with a surrounding area of said installation portion in a reflective surface of said reflective plate.

According to this invention, the reflective plate has an installation portion for installing the LED unit, and the installation portion is formed to be opened in a shape corresponding to the outer circumference shape of the LED unit. In addition, the heat radiation block is held by the reflective plate. This configuration enables to use the heat radiation block with larger size. As a result, the heat generated in the lighting unit is efficiently dissipated through the heat radiation block. As a result, the lighting apparatus is increased its light output by preventing the temperature increase of the LED chip. According to this invention, the LED unit has the flat portion at the light extracting surface from the lighting unit, and the flat portion has the same plane with the surrounding area of the installation portion in the reflective surface of the reflective plate. This configuration enables to prevent the shade in the area around the lighting unit.

It is preferred that the lighting apparatus is configured so that said LED unit is detachably attached to said heat radiation block under the condition that said reflective plate is attached to said main body, and said the other surface of said LED unit surface-contacts with said heat radiation block.

According to this invention, the LED unit is enabled to be detachably attached to the heat radiation block under the condition that the reflective plate is attached to the main body. The LED unit is thus attached/detached to the heat radiation block without removing the reflective plate from the main body. As a result, the LED unit is easily replaced. According to this invention, abovementioned the other surface of the LED unit is configured to surface-contact with the heat radiation block. This configuration has less thermal resistance compared with the case in which a part of the reflective plate is disposed between the LED unit and the heat radiation block. As a result, this configuration enables to improve the heat radiation property.

It is preferred that said heat radiation block has a plane size larger than that of said LED unit.

This invention enables to diffuse the heat in a wide range through the heat radiation block. This configuration enables to improve the heat radiation property.

It is preferred that the lighting apparatus further comprises a light transmissive cover having a gutter shape, said light transmissive cover being configured to be detachably attached to said reflective plate so as to cover said LED unit and said surrounding area of said installation portion in said reflective plate.

This invention enables to protect the LED unit by the light transmissive cover.

It is preferred that said light transmissive cover has light diffusion property of diffusing the light emitted from said LED unit.

This invention enables to illuminate the reflective surface of the reflective plate uniformly.

It is preferred that said LED unit is composed of a plurality of LED modules, each of said LED modules being provided with the same number of said lighting units, said LED modules being formed in the same size with each other, said LED modules being arranged side by side in the longitudinal direction of said installation portion.

This invention enables, when one of the lighting units is break down, to replace one LED module including this lighting unit instead of replacing the entire LED unit. It leads to reduce the cost.

It is preferred that said LED unit comprises a circuit board, said circuit board being provided on one surface thereof with a circuit pattern which defines the relation of connection between said lighting units, said one surface being the opposite side with respect to said heat radiation block, said circuit board being provided with a plurality of opening windows for installing respective said lighting unit, said opening window being formed penetratingly in the thickness direction of said circuit board, said circuit board is provided on said one surface with a mirror for reflecting the light emitted from said lighting units, and the surface of said mirror is in the same plane with said flat portion.

According to this invention, the lighting apparatus has less thermal resistance between the lighting unit and the heart radiation block compared with the case of mounting the lighting unit on a circuit board which defines the relation of connection between the lighting units. As a result, this invention enables to improve the heat radiation property. According to this invention, the surface of the mirror formed at the circuit board has the same plane with the abovementioned flat portion. This configuration enables to prevent the shade in the area around the lighting unit due to the circuit board.

It is preferred that said lighting unit comprises: said LED chip; a mounting substrate having a patterned conductor for feeding said LED chip with electricity on one surface side thereof, said LED chip being mounted on said one surface of said mounting substrate; a dome-shaped optical member configured to control the distribution of the light emitted from said LED chip, said optical member being secured to said one surface of said mounting substrate so as to house said LED chip together with said mounting substrate; a sealing member formed of light transmissive sealing material, said sealing member being filled in a space confined between said optical member and said mounting substrate so as to seal therewith said LED chip; and a dome-shaped color conversion member made of light transmissive material with phosphor, said phosphor being excited by the light which is emitted from said LED chip and then travels through said sealing member and said optical member so as to emit the light of a color different from the emission color of said LED chip, said color conversion member being disposed on said one surface of said mounting substrate so as to form an air layer being interposed between said optical member and said color conversion member.

According to this invention, an air layer is formed between the dome shaped color conversion member and the optical member. A part of the light emitted from the LED chip travels to the color conversion member through the sealing member and the optical member, and then scattered by the phosphor in the color conversion member. This configuration enables to suppress the scattered light from traveling from the color conversion member to the optical member. As a result, the lighting unit is increased its light output. In addition, the reflective surface of the reflective plate is illuminated by the light which is scattered by the phosphor into the reflective surface direction and/or the light which is emitted by the phosphor into the reflective surface direction.

It is preferred that said mounting substrate comprises: a heat conducting plate formed of a heat conductive material, said LED chip being mounted on a mounting surface of said heat conducting plate through a sub-mount member; and a printed circuit plate provided with said patterned conductor, said printed circuit plate being fixed on said mounting surface side of said heat conducting plate, said printed circuit plate being formed with an exposure opening for exposing said sub-mount member, said exposure opening being formed penetratingly in the thickness direction of said printed circuit plate, said sub-mount member has a larger plain size than said LED chip, and said sub-mount member is provided with a reflective film for reflecting the light, said reflective film being formed so as to surround the overlap region with said LED chip.

According to this invention, the LED chip is mounted on the heat conducting plate. This configuration has less thermal resistance between the LED chip and the heart radiation block compared with the case of mounting the LED chip on the printed circuit plate. As a result, this configuration enables to improve the heat radiation property. According to this invention, the sub-mount member is formed with a reflective film for reflecting the light emitted from the LED chip. With this configuration, the light emitted from the LED chip can be prevented from being absorbed into the sub-mount member, thereby it leads to improve the light extraction efficiency.

Note that, it is not essential in this invention that "said installation portion being formed to be opened in a shape corresponding to the outer circumference shape of said LED unit". It is sufficient in this invention that the reflective plate has the installation portion for installing the LED unit.

In one embodiment, said reflective plate has said installation portion for installing said LED unit, said installation portion being formed to be opened in a shape corresponding to the outer circumference shape of said LED unit.

In one embodiment, said reflective plate has a depressed portion. Said depressed portion has a shape corresponding to the outer circumference shape of said LED unit. The depressed portion is formed so as to be installed said LED unit therein.

Said reflective plate has a first height. Said first height is defined along with the thickness direction of said LED unit. It is preferred that said first height of said reflective plate is set so that said flat portion at the light extracting surface from said lighting unit in said LED unit is in the same plane with said surrounding area of said installation portion in said reflective surface of said reflective plate.

It is preferred that said reflective plate has an adjusting piece. Said adjusting piece extends from said reflective plate toward said heat radiation block. Said adjusting piece extends into the thickness direction of said LED unit. Said adjusting piece has said first height in the thickness direction of said LED unit. Thereby, the height of said reflective plate is determined by said adjusting piece. Said first height of said adjusting piece is set so that said flat portion at the light extracting surface from said lighting unit in said LED unit is in the same plane with said surrounding area of said installation portion in said reflective surface of said reflective plate.

Said LED unit has a first thickness in the thickness direction of said LED unit. It is preferred that said first height and said first thickness are set so that said flat portion at the light extracting surface from said lighting unit in said LED unit is in the same plane with said surrounding area of said installation portion in said reflective surface of said reflective plate.

It is preferred that said heat radiation block has a planar surface. Said reflective plate and said LED unit are attached to said planar surface. Said first thickness is set to be same with said first height.

In these cases, the flat portion at the light extracting surface from the lighting unit in the LED unit is in the same plane with the surrounding area of the installation portion in the reflective surface of the reflective plate. As a result, it enables to prevent the shade in the area around the lighting unit.

It is preferred that said adjusting piece has a contact piece. Said contact piece extends in the direction intersecting with the thickness direction of said LED unit. Said contact piece surface-contacts with said heat radiation block.

It is preferred that said adjusting piece has a contact piece. Said contact piece extends in the direction orthogonal to the thickness direction of said LED unit. Said contact piece surface-contacts with said heat radiation block.

In these cases, a part of the heat in the heat radiation block transferred from the LED unit is efficiently radiated through the reflective plate. That is, the reflective plate also serves as a heat radiating element. As a result, the heat radiation block may be formed in a small size, it leads to reduce the weight and the cost.

It is preferred that said contact piece extends from said adjusting piece into the opposite side with respect to said LED unit.

It is preferred that said adjusting piece has a first end at its one end in the height direction. Said contact piece extends from said first end of said adjusting piece into the opposite side with respect to said LED unit.

The contact piece rises in temperature when the heat is transferred from the heat radiation block to the contact piece. The contact piece expands due to the rise in temperature of the contact piece. In this configuration however, the contact piece extends into the opposite direction to the LED unit. As a result, the contact piece expands into the opposite direction to the LED unit due to rise in temperature of the contact piece. In other words, the contact piece does not expand toward the LED unit. This configuration enables to maintain the gap between the reflective plate and the LED unit constant. That is, even in the configuration having a narrow gap between the reflective plate and the LED unit, the contact piece does not apply a pressure upon the LED unit due to the expansion of the contact piece.

It is preferred that said reflective plate has a depressed portion. Said depressed portion has a shape corresponding to the outer circumference shape of said LED unit. Said depressed portion is formed so as to be installed said LED unit therein. Said depressed portion defines said installation portion.

It is preferred that said installation portion has a peripheral wall and a bottom wall. Said peripheral wall is defined by said adjusting piece. Said bottom wall is defined by said contact piece. Said LED unit contacts with said heat radiation block through said bottom wall.

It is preferred that said lighting unit comprises: said LED chip; a mounting substrate on which said LED chip is mounted on one surface thereof; and an optical component secured to said one surface of said mounting substrate so as to house said LED chip therein together with said mounting substrate. Said optical component has an outer peripheral edge. Said outer peripheral edge of said optical component is secured to said one surface of said mounting substrate. Said flat portion at the light extracting surface is defined as the area outside than said outer peripheral edge.

It is preferred that said optical component comprises an optical member. Said optical member is configured to control the distribution of the light emitted from said LED chip. Said optical member is secured to said one surface of said mounting substrate so as to house said LED chip together with said mounting substrate. Said optical member has a dome shape.

It is preferred that said optical component further comprises a color conversion member. Said color conversion member comprises a phosphor and a light transmissive material, said phosphor being excited by the light which is emitted from said LED chip to emit the light of a color different from the emission color of said LED chip. Said color conversion member is disposed on said one surface of said mounting substrate, so as to form an air layer being interposed between said optical member and said color conversion member. Said color conversion member has a dome shape.

It is preferred that said lighting apparatus further comprises an attachment means. Said LED unit is attached with respect to said heat radiation block through said attachment means.

It is preferred that said attachment means is composed of a spring. Said spring is arranged so as to bias said LED unit towards said heat radiation block.

It is preferred that said spring is composed of a plate spring. Said plate spring has a first portion extending from said peripheral edge toward inside of said peripheral edge. Thereby, said LED unit is interposed between said first portion of said plate spring and said heat radiation block.

It is preferred that said plate spring further has a second portion. Said second portion extends from said first portion into the opposite side with respect to said heat radiation block. Said second portion is located between said LED unit and said reflective plate.

In these cases, the LED unit is easily attached to the heat radiation block. Also, the LED unit is easily detached from the heat radiation block. Moreover, this configuration makes it possible that the LED unit is attached so as to be closely contact to the heat radiation block.

It is preferred that said lighting apparatus comprises an attachment means. Said LED unit is made contact with said reflective plate through said attachment means.

It is preferred that said installation portion has a peripheral edge. Said peripheral edge has a first side inner surface and a second side inner surface. Said second side inner surface is opposite to said first inner surface. Said attachment means is arranged on said first side inner surface. Said LED unit is held by said attachment means and said second side inner surface so that said LED unit makes contact with said second side inner surface of said reflective plate.

In this case, the heat generated in the LED unit can be dissipated through the heat radiation block and the reflective plate.

It is preferred that said attachment means is composed of a spring. Said spring is configured to bias said LED unit towards said second side inner surface, thereby said LED unit makes contact with said second side inner surface of said reflective plate.

In this case, the spring enables to relieve the acting force caused by the thermal expansion of the LED unit or reflective plate.

Advantageous Effects of Invention

The invention makes it possible to prevent the temperature increase of the LED chip and to increase the light output. In addition, this invention makes it possible to prevent the area around the lighting unit from being shaded.

DESCRIPTION OF EMBODIMENTS

First Embodiment

Figure 1:
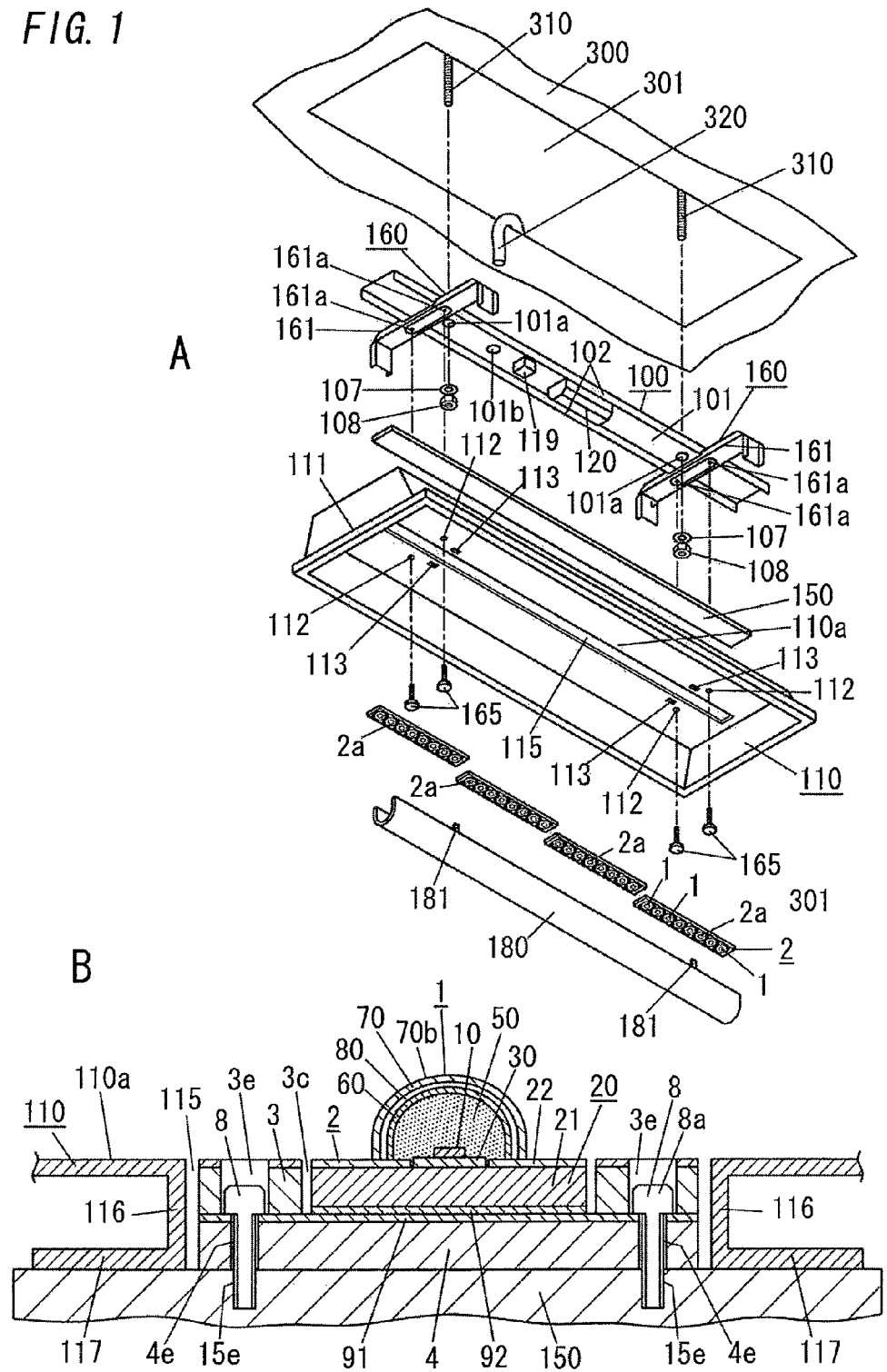
FIG. 1A shows a schematic exploded perspective view of the lighting apparatus in the first embodiment.
FIG. 1B shows a detail schematic side cross sectional view of the lighting apparatus in the first embodiment.

The explanation of the lighting apparatus of this embodiment is made with FIG. 1 to FIG. 7.

This embodiment discloses the lighting apparatus which is adapted to be installed to the ceiling. The lighting apparatus includes a main body 100 having an elongated shape. The main body 100 is installed to the installation hole 301 which has a rectangular shape and which is formed through the ceiling 300 defined as an installation surface. The main body 100 is installed behind the ceiling through the installation hole 301. The main body 100 is made from the metal plate having a rectangular shape. Both sides in a lateral direction of the metal plate are bent, whereby the main body 100 is made from the metal plate. (The metal plate is exemplified by the steel plate made of chromium-free zinc.) The main body 100 has a U-shape to be opened to a lower direction viewing in the side cross section perpendicular to the longitudinal direction. Consequently, the main body 100 has a main plate 101 and a pair of side plates 102. The main plate 101 is elongated to have a rectangular shape. The side plates 102 each extend to lower directions from both edges in the width direction of the main plate 101. It is noted that the main body 100 may be made of metal, whereby the main body 100 is not limited its material especially.

The main plate 101 of the main body 100 is formed with two bolt insert holes 101a which are provided for passing two mounting bolts 310, respectively, which are suspended from behind the ceiling. Therefore, according to inserting the mounting bolts 310 into the bolt insert holes 101*a* and fastening the mounting bolts 310 to nuts 108 with the washer 107 therebetween, the main body 100 is coupled to the mounting bolts 310. Furthermore, the main plate 101 of the main body 100 is formed with a distribution hole 101*b* introducing the power line 320 which is provided in advance behind the ceiling. The power line 320 is connected to the external power source (such as the alternating current source such as commercial power source or the direct current source).

The main body 100 includes a terminal block 119 and a lighting device 120. The terminal block 119 and the lighting device 120 are disposed within a space surrounded by the main plate 101 and both the side plates 102. The terminal block 119 is prepared as the power source to which the power line 320 is connected. The lighting device 120 receives the electrical power from the external power source via the terminal block 119. The lighting device 120 provides the electrical power for lighting the LED unit 2 (which is explained later). The lighting device 120 is replaceably attached to the main body 100.

Figure 7:
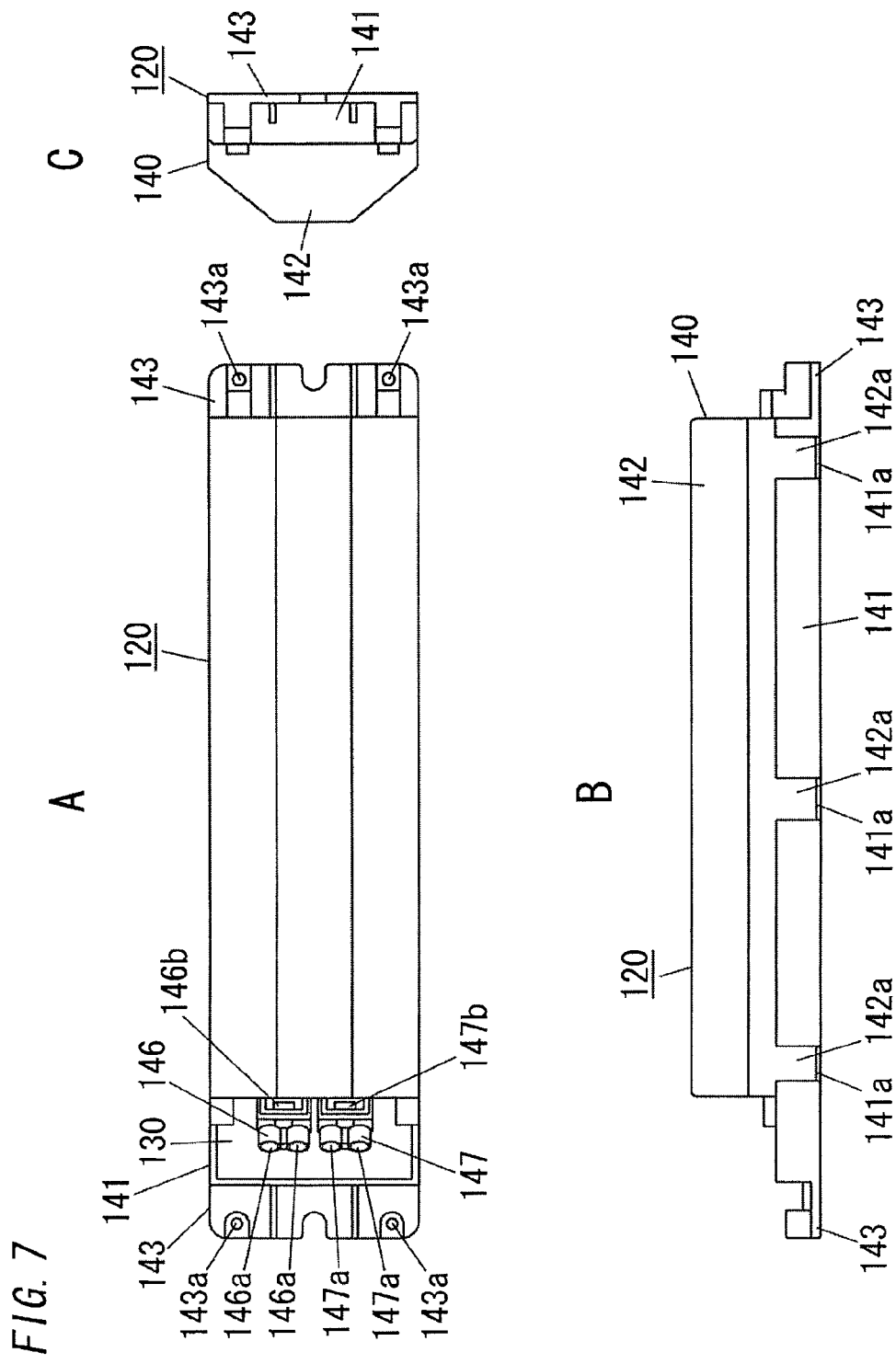
FIG. 7A shows a schematic planar view of the lighting device of the lighting apparatus of the above.
FIG. 7B shows a schematic front view of the lighting device of the lighting apparatus of the above.
FIG. 7C shows a schematic side view of the lighting device of the lighting apparatus of the above.

As shown in FIG. 7, the lighting device 120 includes a printed-wiring board 130 and a case 140. The printed-wiring board 130 is equipped with components (not shown in the figures) of lighting circuit (not shown in the figures) for lighting the LED unit 2. The printed-wiring board 130 is disposed in the case 140.

The case 140 includes a body 141 and a cover 142. The body 141 made of resin is formed in a shape having an opening at its front side. The cover 142 made of resin is formed in a shape having an opening at its rear side, and coupled to the front side of the body 141. Herein, the body 141 is formed with engaging recesses 141*a* at both sides in the lateral direction, respectively. The cover 142 is provided with engaging projections 142*a* at both rear side edges in the lateral direction, respectively. The engaging projection 142*a* protrudes rearwardly from the rear side edge. The body 141 is attached to the cover 142 by engaging the engaging projections 142*a* with the engaging recesses 141*a*.

The body 141 is formed with attachment pieces 143 at rear side of the longitudinal both end faces. The attachment pieces 143 protrude along the longitudinal direction of the body 141, respectively. The case 140 is attached to the main body 100 through the attachment piece 143. Herein, the attachment piece 143 is formed with an attachment hole 143*a* for passing a screw (not shown in the figures). The main body 100 is formed with a screw hole (not shown in the figures). Passing the screw through the attachment hole 143*a*, and screwing with the screw hole, thereby the case 140 is attached to the main body 100. The body 141 and the cover 142 of the case 140 may be made of such as metal instead of the resin. The attaching method of the body cover 142 with the body 141 is not limited above.

The printed-wiring board 130 is equipped with two terminal arrangements 146, 147. The terminal arrangements 146, 147 are arranged on the printed-wiring board 130 at the area without covered by the cover 142. The terminal arrangements 146, 147 include thereinside screwless terminals (not shown in the figures), respectively. The screwless terminal includes a terminal piece (not shown in the figures) for being connected with an electric wire installed through an insertion hole 146*a* or 147*a*, and a chain spring (not shown in the figures) for holding the electric wire together with the terminal piece. A connecting piece (not shown in the figures) is provided extendingly from the terminal piece of the each terminal arrangement 146, 147. The connecting piece is jointed to the printed-wiring board 130 through solder. Each of the terminal arrangements 146, 147 is formed with a handling hole 146*b*, 147*b* for handling a release button (not shown in the figures). When the release button is handled through the handling hole 146*b*, 147*b*, the terminal arrangement 146, 147 releases the holding condition in which the electric wire is held through the chain spring. The screwless terminal and the release button are not limited in the above configuration, and other configuration may be used.

One terminal arrangement 146 constitutes the power source side terminal arrangement for being connected to the electric wire from the terminal block 119. The other terminal arrangement 147 constitutes the load side terminal arrangement for being connected to the electric wire 330 (refer to FIG. 4) for feeding the LED unit 2 with electricity.

The lighting apparatus of this embodiment includes an LED unit 2 having elongated shape and a reflective plate 110 made of metal. The LED unit 2 is provided with a plurality of lighting units 1 each having a LED chip 10. The lighting units 1 are arranged on one surface side in the thickness direction of the LED unit 2. The reflective plate 110 is attached to the main body 100. The light from the LED unit 2 is adjusted to an intended distribution by the reflective plate 110. The LED unit 2 is composed of a plurality (four in the illustrated example) of LED modules 2*a*. Each of the LED modules 2*a* has the same number (eight in the illustrated example) of the lighting units 1, respectively, and formed in the same size with each other. The reflective plate 110 is formed of a steel plate, and is applied a high-reflection coating of white powder. Surface of the coating constitutes a reflective surface 110*a*. Material of the reflective plate 110 is not limited particularly, may be Aluminum.

The reflective plate 110 is attached to two adapters 160. The two adapters 160 are attached to each ends of the main body 100, respectively.

The adapter 160 is formed in a U-shape to be opened to a lower direction. Center piece 161 of the adapter 160 is attached to the main body 100 in a manner that the longitudinal direction of the center piece 161 is orthogonal to the longitudinal direction of the main body 100. The reflective plate 110 is attached to the respective center pieces 161 through attachment screws 165 of so-called finger screws. The reflective plate 110 is formed with insert holes 112 for passing the corresponding attachment screw 165. Each of the center pieces 161 of the adapter 160 is formed with screw holes 161*a* each of which being screwed with the attachment screw 165.

The reflective plate 110 is formed in a gutter shape having opened lower side and closed both ends in the longitudinal direction. The reflective plate 110 includes a flange 111. The flange 111 extends outward from lower end of the reflective plate 110. The reflective plate 110 is installed to the installation hole 301 of the ceiling 300. The flange 111 is provided so as to contact with the lower surface of the ceiling 300 at around of the installation hole 301.

The reflective plate 110 has an installation portion 115 formed to be opened in a shape (elongated rectangular shape) corresponding to the outer circumference shape of the LED unit 2. The LED unit 2 is installed to the installation portion 115. In the lighting apparatus of this embodiment, the LED unit 2 has a flat portion at a light extracting surface from the lighting unit 1. The flat portion is made to be in the same plane with the surrounding area of the installation portion 115 in the reflective surface 110*a* of the reflective plate 110. The reason of this configuration is described later.

A light transmissive cover 180 is detachably attached to the reflective plate 110. The light transmissive cover 180 is made of light transmissive material (such as acrylic resin), and is formed in a gutter shape covering the LED unit 2. A plurality (four in this embodiment) of association legs 181 extend from the edges of the light transmissive cover 180. Two of the association legs 181 are formed at one edge along the longitudinal direction of the light transmissive cover 180, and residual two association legs 181 are formed at the other edge. Each of the association legs 181 has an association projection 181*a* at its tip part (refer to FIG. 2). The reflective plate 110 is formed with association holes 113 configured to be inserted and coupled with the respective association leg 181. Each of the association legs 181 of the light transmissive cover 180 is inserted to the corresponding association hole 113 of the reflective plate 110 so as to latching each the association projections 181*a* with the circumference of the corresponding association hole 113, thereby the light transmissive cover 180 is detachably attached to the reflective plate 110. Pinching the longitudinal both end parts of the light transmissive cover 180 by respective hands to release the association projections 181*a* from the association holes 113 and thereafter pulling the light transmissive cover 180 downward, thereby the light transmissive cover 180 is detached from the reflective plate 110.

The lighting apparatus of this embodiment includes a heat radiation block 150 made of metal (which having high thermal conductivity such as Al, Cu) for radiating the heat generated in the LED unit 2. The heat radiation block 150 is arranged on the other surface side in the thickness direction of the LED unit 2. The LED unit 2 is replaceably attached to the heat radiation block 150. The heat radiation block 150 is formed in an elongated plate shape. The heat radiation block 150 has a plurality of fins 152 on the opposite side to the attaching side of the LED unit 2 (refer to FIG. 2). Each of the fins 152 extends along the longitudinal direction of the heat radiation block 150. The fins 152 are arranged in an equal pitch in the lateral direction of the heat radiation block 150.

The heat radiation block 150 is fixed to the reflective plate 110 through screws (not shown in the figures). In other words, the heat radiation block 150 is held by the reflective plate 110.

Figure 5:
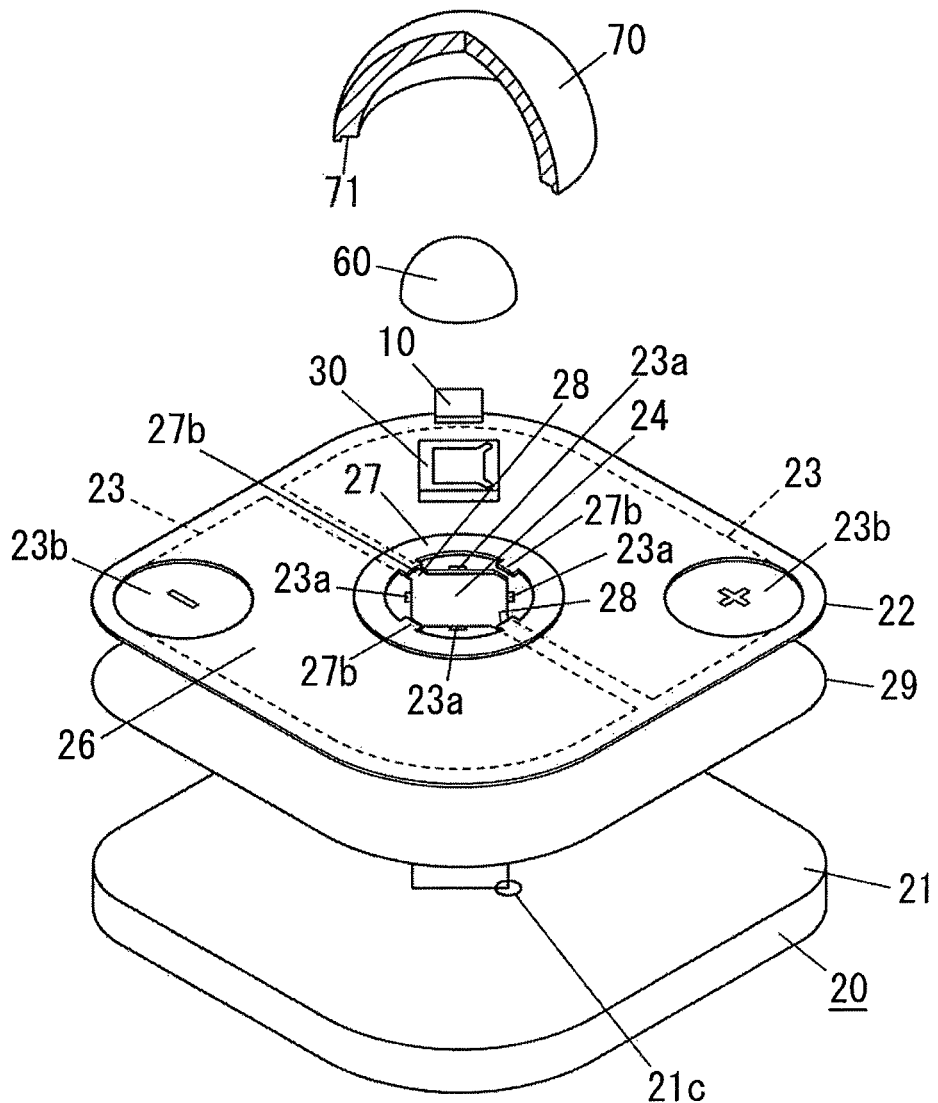
FIG. 5 shows a schematic exploded perspective view of the lighting unit of the lighting apparatus of the above.
Figure 6:
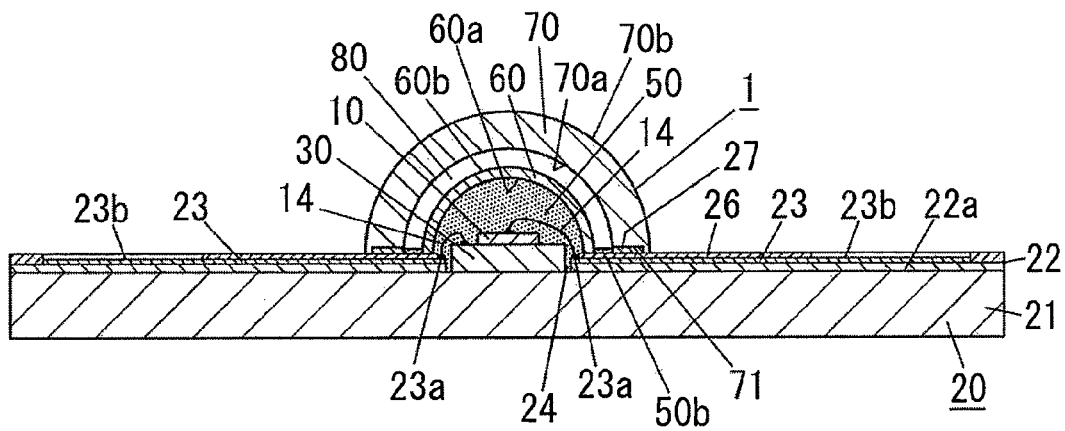
FIG. 6A shows a schematic cross sectional view of the lighting unit of the lighting apparatus of the above.
FIG. 6B shows another schematic cross sectional view of the lighting unit of the lighting apparatus of the above.
Figure 6:
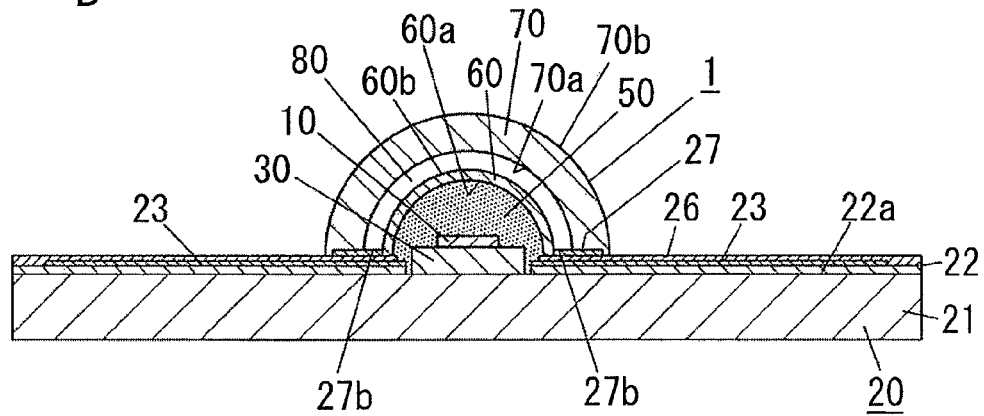

As shown in FIGS. 5 and 6, the lighting unit 1 includes an LED chip 10 and a mounting substrate 20 having rectangular plate shape. The mounting substrate 20 has patterned conductors 23, 23 for feeding said LED chip 10 with electricity on one surface side of the mounting substrate 20. The LED chip 10 is mounted on this one surface of the mounting substrate 20. The lighting unit 1 further includes an optical member 60 configured to control the distribution of the light emitted from the LED chip 10. The optical member 60 is made of light transmissive material, and formed in a dome shape. The optical member 60 is secured to the abovementioned one surface of the mounting substrate 20 so as to accommodate the LED chip 10 together with the mounting substrate 20. Sealing member 50 formed of light transmissive sealing material (such as encapsulation resin) is filled in a space confined between the optical member 60 and the mounting substrate 20. The sealing member 50 seals therewith the LED chip 10 and a plurality (e.g. two) of bonding wires 14 electrically connected to the LED chip 10. The sealing member 50 is preferably formed of silicone resin (as the encapsulation resin) to be in a gel form. The lighting unit 1 includes a dome-shaped color conversion member 70. The color conversion member 70 is made of light transmissive material with a phosphor. The phosphor is excited by the light which is emitted from the LED chip 10 and then travels through the sealing member 50 and the optical member 60, so as to emit the light of a color different from the emission color of the LED chip 10. The color conversion member 70 is disposed on the abovementioned one surface of the mounting substrate 20, so as to surround the LED chip 10 and the like. In detail, the color conversion member 70 is disposed on the abovementioned one surface of the mounting substrate 20, so as to form an air layer 80 being interposed between a light output surface 60*b* of the optical member 60 and the color conversion member 70. The mounting substrate 20 is provided at the abovementioned one surface with weir member 27 having a ring shape. The weir member 27 is formed outside of the optical member 60 to protrude from the abovementioned one surface of the mounting substrate 20. The weir member 27 acts to prevent the overflowed encapsulation resin from flowing outside during securing the optical member 60 to the mounting substrate 20.

The LED chip 10 is a GaN-based blue-color LED chip emitting a blue light. An n-type SiC substrate is used for a substrate for crystal growth, instead of sapphire substrate. The n-type Sic substrate has a close lattice constant and close crystal structure to GaN compared with the sapphire substrate, and has superior electrical conductivity. This LED chip 10 includes a light emitting section which is formed of GaN-based compound-semiconductor material and formed on the main surface side of the SiC substrate. The light emitting section may be formed in a laminate structure having double heterostructure. The light emitting section may be grown by epitaxial growth (such as MOVPE). The anode (not shown in the figures) is provided on one surface (upper side in FIG. 6A) of the LED chip 10, and the cathode is provided on the other surface (lower side in FIG. 6A) thereof. Each of the anode and the cathode is formed of a laminate including Ni film and Au film in this embodiment. The material of the anode and the cathode is not particularly limited so long as giving a good Ohmic characteristic, and may be Al. The structure of the LED chip 10 is not particularly limited. For example, the LED chip 10 may be such an LED chip formed by: forming the light emitting section on the main surface of the substrate for crystal growth by epitaxial growth; securing the light emitting section to a support substrate (such as Si substrate); and removing the substrate for crystal growth.

The mounting substrate 20 includes a heat conducting plate 21 formed of a heat conductive material and a printed circuit plate 22. The LED chip 10 is mounted on a mounting side surface of the heat conducting plate 21 through a sub-mount member 30. The printed circuit plate 22 is provided with the patterned conductors 23, 23. The printed circuit plate 22 is fixed on the mounting surface side of the heat conducting plate 21.

The heat conducting plate 21 and the printed circuit plate 22 are formed in a rectangular shape, respectively. The middle position of the printed circuit plate 22 is provided with a rectangular exposure opening 24 penetrating in the thickness direction for exposing the sub-mount member 30. The sub-mount member 30 is formed in a rectangular shape with a smaller plain size than the heat conducting plate 21, and is provided in the exposure opening 24. In short, the LED chip 10 is mounted on the heat conducting plate 21 via the sub-mount member 30 which is disposed inside the exposure opening 24 of the printed circuit plate 22. In this configuration, the heat generated in the LED chip 10 is transferred, not through the printed circuit plate 22, to the sub-mount member 30 and the heat conducting plate 21. The heat conducting plate 21 is provided at the mounting side surface with an alignment mark 21*c* in order to improve the positioning precision of the sub-mount member 30. The printed circuit plate 22 is adhered to the heat conducting plate 21 through preferably a polyolefin-based fixing sheet 29 (refer to FIG. 5).

The heat conducting plate 21 is formed of Cu in this embodiment, but may be formed of other heat conductive material such as Al. In short, the heat conductive material of the heat conducting plate 21 is preferably a metal having high thermal conductivity such as Al, Cu. In this embodiment, the LED chip 10 is mounted on the heat conducting plate 21 so that the substrate for crystal growth is located between the light emitting section and the heat conducting plate 21, but not limited in this configuration. The LED chip 10 may be mounted on the heat conducting plate 21 so that the light emitting section is located between the substrate for crystal growth and the heat conducting plate 21. In view of the light extraction efficiency, the LED chip 10 is desirably provided in a manner that the light emitting section thereof is further away from the heat conducting plate 21. However, the substrate for crystal growth has a refractive index comparable with that of the light emitting section in this embodiment. Thus, the light extraction efficiency can be ensured even in the case of providing the LED chip 10 in a manner that the light emitting section being located closer to the heat conducting plate 21.

The printed circuit plate 22 includes an insulation plate 22a formed of a polyimide film. The insulation plate 22a is provided at one surface with a pair of the patterned conductors 23, 23 for feeding the LED chip 10 with electricity. A protection layer 26 formed of white resist (resin) is stacked over the patterned conductors 23, 23 and an area of the insulation plate 22a on which the patterned conductor 23 is not formed. The protection layer 26 allows to reflect at the surface outward the light which is emitted from the LED chip 10 and from the phosphor in the color conversion member 70, and to prevent the light from being absorbed into the printed circuit plate 22. The protection layer 26 therefore enables to improve the light output of the lighting unit 1 due to improved light extraction efficiency. Each of the patterned conductors 23, 23 is formed in a substantially rectangular shape, and has the dimension marginally smaller than half of the dimension of the insulation plate 22a. The insulation plate 22a may be formed of FR4, FR5, paper phenol, or the like.

The protection layer 26 is patterned so that each the patterned conductor 23 is exposed rectangular two terminal portions 23a around a periphery of the exposure opening 24 and is exposed a circular connection electrode 23b near the circumference of the printed circuit plate 22. The terminal portions 23a are respectively connected to bonding wires 14. Each patterned conductor 23, 23 of the printed circuit plate 22 is formed of a laminate including Cu film, Ni film, and Au film. One of the two connection electrodes 23b indicated by "+" (right one in FIG. 5) is electrically connected to the anode of the LED chip 10. The other of the two connection electrodes 23b indicated by "−" (left: one in FIG. 5) is electrically connected to the cathode of the LED chip 10. The connection electrodes 23b, 23b with sign of "+" or "−" are visually identified, and may be free from erroneous electrical connection thereof.

The LED chip 10 is disposed to the heat conducting plate 21 with the sub-mount member 30 being interposed therebetween. The sub-mount member 30 serves to relieve stress acting on the LED chip 10 due to a difference of linear expansion coefficient between the LED chip 10 and the heat conducting plate 21. In this embodiment, the sub-mount member 30 is formed in a rectangular plate shape with the plane size larger than the chip size of the LED chips 10.

The sub-mount member 30 serves to relieve the stress as mentioned above. In addition, by virtue of the sub-mount member 30, the heat generated in the LED chip 10 is transferred to the heat conducting plate 21 in a broader area than the chip size of the LED chip 10. In the lighting unit 1 in this embodiment, the heat generated in the LED chip 10 can be efficiently dissipated through the sub-mount member 30 and the heat conducting plate 21. The lighting unit 1 of this embodiment has less thermal resistance between the LED chip 10 and the heart radiation block 150 compared with the case of mounting the LED chip 10 on the printed circuit plate 22. The sub-mount member 30 in the lighting unit 1 enables to relieve the stress which acts on the LED chip 10 due to a difference of linear expansion coefficient between the LED chip 10 and the heat conducting plate 21.

The sub-mount member 30 of this embodiment is made of AlN which exhibits relatively high thermal conductivity as well as has insulation property. The sub-mount member 30 is provided at its LED chip 10 side surface with a patterned conductor (not shown in the figure) for connected to the cathode. The cathode of the LED chip 10 is electrically connected to one of the two patterned conductor 23 through the bonding wire 14 formed of metallic fine wire (such as metallic wire or aluminum thin wire) and abovementioned not-shown patterned conductor. The anode of the LED chip 10 is electrically connected to the other of the tow patterned conductor 23 through the bonding wire 14. The LED chip 10 may be bonded to the sub-mount member 30 by means of silver paste or solder such as SnPb, AuSn, or SnAgCu. It is preferable that the solder is Pb-free solder such as AuSn or SnAgCu. In case that the LED chip 10 is soldered by use of AuSn to the sub-mount member 30 made of AlN, it is need to preliminarily form metal layers of Au or Ag on the connecting surfaces of the sub-mount member 30 and the LED chip 10. The sub-mount member 30 is preferably bonded to the heat conducting plate 21 by means of Pb-free solder such as AuSn or SnAgCu. In case of bonding by means of AuSn, it is need to preliminarily form a metal layer of Au or Ag on the connecting surface of the heat conducting plate 21.

The sub-mount member 30 is formed of AlN in this embodiment, but may be formed of other material which has a linear expansion coefficient close to the material of the substrate for crystal growth (6H—SiC in this embodiment) and has comparatively high thermal conductivity, such as SiC composite, Si, or CuW. The sub-mount member 30 is configured to transfer the heat as mentioned above. It is preferred that the dimension of the surface of the heat conducting plate 21 in the LED chip 10 side is sufficiently larger than the dimension of the surface of the LED chip 10 in the heat conducting plate 21 side.

In the lighting unit 1 of this embodiment, the sub-mount member 30 is formed to have a thickness so that the height of the surface of the sub-mount member 30 from the heat conducting plate 21 is larger than that of the surface of the protection layer 26 of the printed circuit plate 22. With this configuration, the light emitted laterally from the LED chip 10 can be prevented from being absorbed into the printed circuit plate 22 through an inner wall of the exposure opening 24.

The sub-mount member 30 is formed with a reflective film for reflecting the light emitted from the LED chip 10. The reflective film is formed on the bonding side surface of the sub-mount member 30 around the bonding portion to the LED chip 10. In other words, the reflective film is formed so as to surround the overlap region with the LED chip 10. With this configuration, the light emitted from the side of the LED chip 10 can be prevented from being absorbed into the sub-mount member 30, thereby it leads to further improve the light extraction efficiency. The reflective film of the sub-mount member 30 may be formed of such as a laminate including Ni film and Ag film, but material of the reflective film is not limited particularly. The material of the reflective film may be suitably selected according the emission wavelength of the LED chip 10.

The sealing member 50 of this embodiment is made of silicon resin, but may be made of other one such as acryl resin or glass.

The optical member 60 is a dome-shaped molded article made of light transmissive material (such as silicone resin and glass). In this embodiment, the optical member 60 is composed of a molded article made of silicone resin, enabling to minimize differences in refractive index and linear expansion coefficient between the optical member 60 and the sealing member 50. The optical member 60 is preferably made of acryl resin when the sealing member 50 made of is acryl resin.

The light output surface 60b of the optical member 60 is shaped into a convex curved surface such that the interface between the light output surface 60b and the air layer 80 is free from the total reflection of the light which is incident through the light input surface 60a. The optical member 60 is disposed so that the light axis thereof is coincident with that of the LED chip 10. With this configuration, the emitted light from the LED chip 10 is allowed to easily travel to the color conversion member 70 through the light input surface 60a and the light output surface 60b without totally reflected at the interface between the light output surface 60b and the air layer 80. As a result, the lighting unit 1 enables to give an increased total luminous flux. Note that, the light emitted from the side of the LED chip 10 travels to the color conversion member 70 through the sealing member 50, the optical member 60, and the air layer 80. After then, the light may excite the phosphor in the color conversion member 70, may be scattered by the phosphor, or may pass through the color conversion member 70 without colliding with the phosphor. The optical member 60 is designed to have a constant wall thickness in the normal direction over the entire surface.

The color conversion member 70 is a molded article made of a mixture of light transmissive material (such as silicone resin) and yellowish phosphor particles. The phosphor particle is excited by a blue light emitted from the LED chip 10 to emit a broad yellow light. The lighting unit 1 enables to radiate the blue light emitted from the LED chip 10 and the yellow-light emitted from the yellowish phosphor particle, through an outer surface 70b of the color conversion member 70. This lighting unit 1 thus allows to emit the white color light of mixed light of the blue light and the yellow light. The color conversion member 70 is made of silicone resin in this embodiment, but may be made of other light transmissive material such as acryl resin, glass or organic-inorganic hybrid material which is made of a mixture of organic and inorganic nanoparticles or an organic-inorganic hybrid molecule including organic and inorganic moieties. The phosphor in the color conversion member 70 is the yellowish phosphor in this embodiment, but may be a combination of other fluorescent materials such as a combination of reddish and greenish ones for achieving white-color light. The combination of reddish and greenish phosphors usually exhibits higher color rendering properties.

The color conversion member 70 is formed so that the inner surface 70a thereof follows the shape of the light output surface 60b of the optical member 60, such that the inner surface 70a of the color conversion member 70 is spaced from the light output surface 60b of the optical member 60 by an almost uniform distance over the entire light output surface 60b. The color conversion member 70 is designed to have a constant wall thickness in the normal direction over the entire surface. The color conversion member 70 may be secured at its edge (its peripheral bottom rim) to the mounting substrate 20 by means of adhesive agent (such as silicone resin and epoxy resin).

One example for fabricating the lighting unit 1 is explained below. Firstly, each of the patterned conductors 23, 23 is connected to the LED chip 10 through two of the bonding wires 14. Next, a liquid encapsulation resin (such as silicone resin) is poured through a pouring hole 28 (which is formed continuously with the exposure opening 24 of the printed circuit plate 22; refer to FIG. 5) to be filled inside the exposure opening 24 of the printed substrate 22 around a periphery of the sub-mount member 30, so as to be cured to become one portion of the sealing member 50. Then, the optical member 60 is filled at its interior with a liquid encapsulation resin (such as silicone resin), which composes the other portion of the sealing member 50. Subsequently, the optical member 60 is suitably positioned on the mounting substrate 20. After then, the liquid encapsulation resin is cured to become the sealing member 50 while securing the optical member 60 to the mounting substrate 20. Finally, the color conversion member 70 is secured to the mounting substrate 20. In the above fabrication example of the lighting unit 1, the liquid encapsulation resin needs to be provided to the interior of the optical member 60 sufficiently so as to prevent void-generation inside the sealing member 50.

In the lighting unit 1, the mounting substrate 20 is provided at its abovementioned one surface with the annular weir member 27 which is formed to protrude at outside of the optical member 60. In the process of disposing the optical member 60 securely to the mounting substrate 20, an extra encapsulation resin may overflow from the space confined between the optical member 60 and the mounting substrate 20. The weir member 27 serves to prevent the extra encapsulation resin from flowing outside therethrough. The extra encapsulation resin is remained on the abovementioned one surface side of the mounting substrate 20 in a space surrounded by the optical member 60, the weir member 27, and the protection layer 26. This extra encapsulation resin is cured to form a resinous member 50b shown in FIG. 6A.

The weir member 27 is formed of a white resist, such that the weir member 27 allows to prevent the light, which is emitted from the LED chip 10 or from the phosphor, from being absorbed into the weir member 27. The weir member 27 therefore enables to improve the light output of the lighting unit 1. The weir member 27 is provided with a plurality (four in this embodiment) of centering projections 27b extending inward from its inner circumference, so as to coincide the center of the weir member 27 with the center axis of the optical member 60. These centering projections 27b are equally spaced circumferentially along inner circumference of the weir member 27. In other words, the weir member 27 serves for accurate positioning of the color conversion member 70. The number of the centering projections 27b is four in this embodiment, and preferably three or more. The centering projection 27b is preferably formed to have a small width such that the encapsulation resin can be stored in high amount into a portion confined between the weir member 27 and the optical member 60. The mounting substrate 20 may be provided with an annular recess for the positioning of the color conversion member 70, instead of providing the weir member 27.

The color conversion member 70 is formed at the peripheral bottom rim with a recess 71 for engaging with the weir member 27 along the circumference. The lighting unit 1 in this embodiment allows to precisely position the color conversion member 70 in relation to the mounting substrate 20, as well as shortening the interval between the color conversion member 70 and the optical member 60. The recess 71 is formed so as to open at the inner surface 70a side at the bottom rim.

The connection electrode 23b is composed of the one of the exposed portion of the patterned conductor 23 which is exposed outward the color conversion member 70.

The LED module 2a of the LED unit 2 includes a circuit board 3. The circuit board 3 is provided with a circuit pattern 3b for defining the relation of connection between the lighting units 1 (refer to FIGS. 2 to 4) on one surface thereof. Herein, the abovementioned one surface of the circuit board 3 is defined as the other side surface with respect to the heat radiation block 150. The circuit board 3 is provided with a plurality of opening windows 3c for inserting the respective lighting unit 1. The opening window 3c is formed so as to penetrate in the thickness direction of the circuit board 3. The LED module 2a has a basal plate 4 of a metal plate having a rectangular shape. A plurality of the lighting units 1 and the circuit board 3 are disposed on one surface of the basal plate 4 in the thickness direction. Each of the opening windows 3c has an aperture size larger than the plane size of the mounting substrate 20 of the lighting unit 1. The basal plate 4 of this embodiment is formed of Al, but may be formed of other material such as Cu.

The LED module 2a is detachably attached to the heat radiation block 150 through attachment screws 8 of metal screws. The circuit board 3 of the LED module 2a is formed with through holes 3e each of which having an inner diameter larger than the outer diameter of screw head 8a of the attachment screw 8. The basal plate 4 of the LED module 2a is formed with through holes 4e each of which having an inner diameter smaller than the outer diameter of screw head 8a. The heat radiation block 150 is formed with screw holes 15e each of which being screwed with the attachment screw 8 which is inserted through the through holes 3e, 4e. The screw head 8a of the attachment screw 8 is thus apart from the inner surface of the through hole 3e of the circuit board 3. This configuration allows to have longer creepage distance from the attachment screw 8 to the circuit pattern 3b of the circuit board 3, and to relieve stress acting on the lighting unit 1 due to the attachment screw 8. The circuit board 3 is fixed to the basal plate 4 through assembly screws 7 (refer to FIGS. 2, 4) of resin screws. Each of the lighting unit 1 is bonded to the basal plate 4 through a bonding layer 92 so as to be thermally-coupled to each other. The bonding layer 92 of this embodiment is composed of a resin sheet which contains a filler of silica, alumina or the like and is capable of being reduced in viscosity when heated (e.g., an organic green sheet such as an epoxy resin sheet highly charged with fused silica). The organic green sheet has: electrical insulation property; high thermal conductivity; high flowability during heating; and high adhesion to irregular surfaces. Note that, the basal plate 4 has a high heat capacity in this embodiment. The fixing strength between the lighting unit 1 and the basal plate 4 is thus degraded when heated to about 170 degrees Celsius for curing the organic green sheet. On the other hand, the electric insulation property between the lighting unit 1 and the basal plate 4 is degraded when heated to about 150 degrees Celsius for curing the organic green sheet. In short, the fixing strength and the electric insulation property are in the trade-off relation in the organic green sheet. In view of this problem, the basal plate 4 of this embodiment is further provided with an insulation layer 91 preliminarily arranged on one surface thereof. The insulation layer 91 is formed of an organic green sheet independently provided of the bonding layer 92, and is cured in 170 degrees Celsius. In other words, both of the bonding layer 92 and the insulation layer 91 are disposed between the heat conducting plate 21 and the basal plate 4. The bonding layer 92 secures the fixing strength and the thermal conductivity. The insulation layer 91 secures the electric insulation property and the thermal conductivity.

The circuit board 3 and the basal plate 4 are formed to have the same peripheral shape. The circuit board 3 and the basal plate 4 are formed to have an elongated rectangular shape. Each of the LED modules 2a of the LED unit 2 is formed to have a longitudinal length which is marginally smaller than the length of the longitudinal direction of the installation portion 115 divided by an integer (four in the illustrated example). Also, each of the LED modules 2a is formed to have the lateral length which is marginally smaller than the length of the lateral direction of the installation portion 115. As a result, several kinds of LED unit 2 having different longitudinal length may be formed by changing the number of the LED module 2a. It leads to reduce the cost.

The circuit board 3 includes an organic insulation substrate and the circuit pattern 3b formed on the abovementioned one surface side of the organic insulation substrate. The circuit board 3 is provided on this one surface with mirrors 3d (refer to FIGS. 2, 4) which reflect the light emitted from the lighting unit 1. The mirror 3d of the circuit board 3 is made of a white resist layer. Most part of the circuit pattern 3b is covered by the mirror 3d. The organic insulation substrate of the circuit board 3 may be made of glass epoxy resin such as FR4, polyimide resin, or phenol resin.

The circuit board 3 is provided with a surface-mounted Zener diode 331 for over voltage protection and a surface-mounted ceramic capacitor 332 near each of the opening windows 3c in order to prevent an application of an over voltage to the LED chip 10 of the lighting unit 1.

Figure 3:
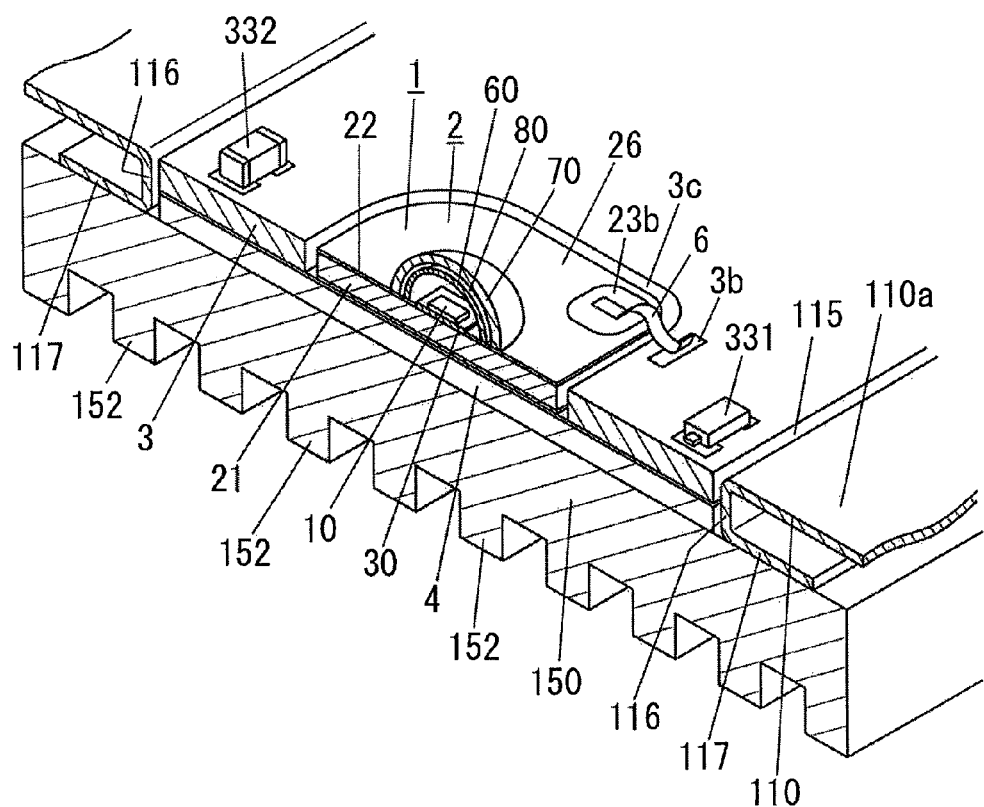
FIG. 3 shows a detail schematic perspective view with cutaway of the lighting apparatus of the above.
Figure 4:
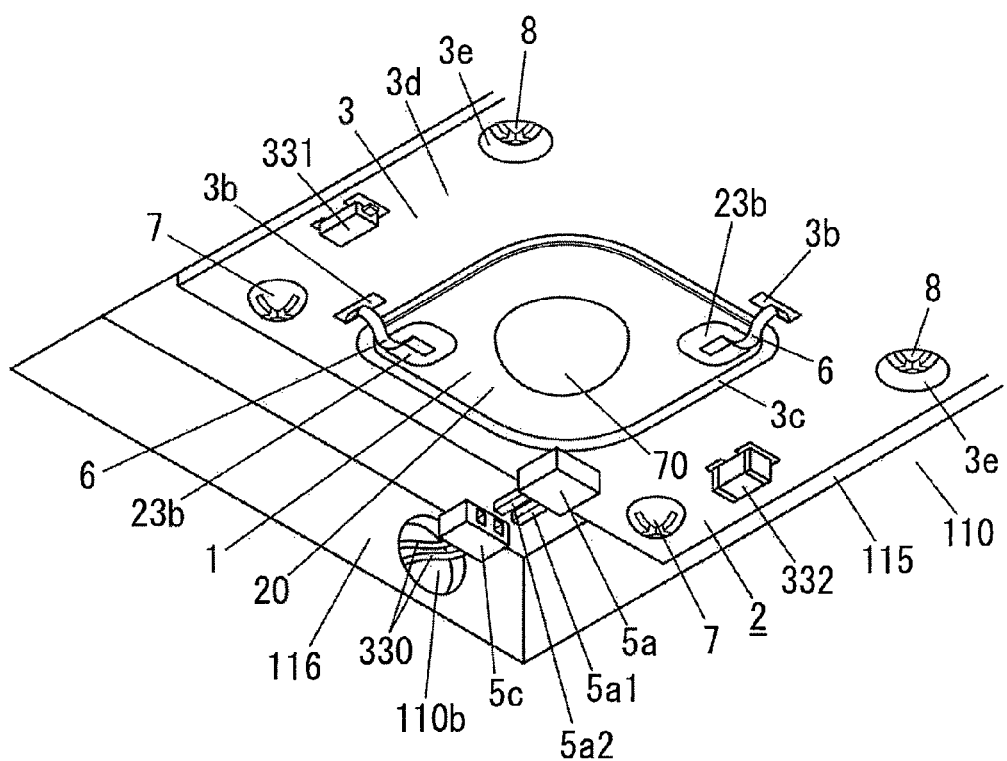
FIG. 4 shows a detail schematic perspective view with cutaway of the lighting apparatus of the above.

In the lighting unit 1 of this embodiment, each connection electrodes 23b is electrically connected to the circuit pattern 3b of the circuit board 3 through a terminal plate 6, as shown in FIGS. 3, 4. The terminal plate 6 may be a jumper pin.

Each of the circuit board 3 of the LED module 2a is connected to the adjacent one so that all of the lighting units 1 are connected in series. Each of the circuit board 3 of the LED module 2a is provided at longitudinal one end with a male connector 5a (refer to FIGS. 2, 4), and is provided at longitudinal the other end with a female connector 5b (refer to FIG. 2). The circuit pattern 3b of the circuit board 3 is formed so as to electrically connect a first contact terminal 5a1 of the male connector 5a with a first contact (not shown in the figures) of the female connector 5b in a manner that the LED chips 10 are installed therebetween. Also, the circuit pattern 3b is formed to electrically connect a second contact terminal 5a2 of the male connector 5a directly with a second contact (not shown in the figures) of the female connector 5b to be short-circuited. Then in this embodiment, a pair of the electric wires 330 connected to the lighting device 120 is provided at its end with a female connector 5c (refer to FIG. 4) having same structure with the female connector 5b in the circuit board 3. The female connector 5c is connected to the male connector 5a of the far left LED module 2a in FIG. 1A (as shown in FIG. 4). The female connector 5b in the far right LED module 2a is connected to a connector (not shown in the figures) for short-circuiting the contacts of the female connector 5b. As a result, the lighting device 120 supplies the electric power to the all of the LED chips 10 of the LED unit 2 which are connected in series.

In the lighting apparatus of this embodiment, the LED unit 2 has a flat portion at the light extracting surface from the lighting unit 1. The reflective plate 110 has a surrounding area of the installation portion 115 in the reflective surface 110a. This embodiment is configured so that the flat portion is in the same plane with the surrounding area as shown in FIG. 1B. The light extracting surface is composed of: a surface of the lighting unit 1 which contacts with surrounding medium (i.e. air) and the light is emitted therefrom; and a surface of the lighting unit 1 which contacts with surrounding medium (i.e. air) and the light is finally reflected thereby. In short, the surface of the protection layer 26 of the lighting unit 1 composes the abovementioned flat portion of the LED unit 2. The reflective plate 110 is extendingly provided with an adjusting piece 116 from the surrounding part of the installation portion 115 toward the heat radiation block 150 in order to make the surrounding area of the installation portion 115 in the reflective surface 110*a* of the reflective plate 110 to be in the same plane with the flat portion. Also, contact piece 117, the surface of which contacts with the surface of the heat radiation block 150, is provided extendingly outward from the end part of the adjusting piece 116. This embodiment is configured so that the surface of the mirror 3*d* of the circuit board 3 is in the same plane with the abovementioned flat portion. In this embodiment, the adjusting piece 116 is formed with a insertion hole 110*b* for inserting the pair of electric wires 330. The insertion hole 110*b* is formed in a circular shape with a sufficient inner diameter for inserting the female connector 330.

As explained above, with the lighting apparatus of this embodiment, the reflective plate 110 has an installation portion 115 which is formed to be opened in a shape corresponding to the outer circumference shape of the LED unit 2 and which the LED unit 2 is installed in. In addition, the heat radiation block 150 is held by the reflective plate 110. This configuration enables to use the heat radiation block 150 of larger size. As a result, the heat generated in the lighting unit 1 is efficiently dissipated through the heat radiation block 150, thereby the lighting apparatus is increased its light output by preventing the temperature increase of the LED chip 1. In addition, the lighting apparatus of this embodiment is configured so that the LED unit 2 has a flat portion at the light extracting surface from the lighting unit 1, and the flat portion has the same plane with the surrounding area of the installation portion 115 in the reflective surface 110*a* of the reflective plate 110. This configuration enables to prevent the shade in the area around the lighting unit 1. Furthermore, the surface of the mirror 3*d* formed on the circuit board 3 is in the same plane with the abovementioned flat portion. This configuration enables to prevent the shade in the area around the lighting unit 1 due to the circuit board 3. Moreover, the lighting apparatus of this embodiment has less thermal resistance between each of the lighting unit 1 and the heart radiation block 150 compared with the case of mounting the lighting unit 1 on a circuit board defining the relation of connection between the lighting units 1. As a result, this configuration enables to improve the heat radiation property.

The lighting unit 1 of the lighting apparatus of this embodiment is formed to have the air layer 80 between the dome shaped color conversion member 70 and the optical member 60. This configuration enables to reduce the light which travels from the color conversion member 70 to the optical member 60 from among the light which is emitted from the LED chip 10, travels to the color conversion member 70 through the sealing member 50 and the optical member 60, and scattered by the phosphor in the color conversion member 70. As a result, the lighting unit 1 is increased its light extracting efficiency. In addition, the reflective surface 110*a* of the reflective plate 110 is illuminated by the light which is scattered by the phosphor toward the reflective surface 110*a* and the light which is emitted by the phosphor toward the reflective surface 110*a*.

In the lighting apparatus of this embodiment, the abovementioned the other surface of the LED unit 2 contacts with the surface of the heat radiation block 150. This configuration has less thermal resistance compared with the case in which a part of the reflective plate 110 is disposed between the LED unit 2 and the heat radiation block 150. As a result, this configuration enables to improve the heat radiation property.

In the lighting apparatus of this embodiment, the heat radiation block 150 is formed to have the plane size larger than that of the LED unit 2. The heat radiation block 150 with larger size is enabled to diffuse the heat in a wide range. As a result, the heat radiation property can be improved. The heat radiation block 150 may be formed to have longer lateral length than that of the LED unit 2. This configuration makes it possible to diffuse the heat generated in the lighting unit 1 in further wide range.

In the lighting apparatus of this embodiment, the contact piece 117 for contacting the surface of the heat radiation block 150 is continuously provided from the surrounding area of the installation portion 115 in the reflective plate 110. By virtue of this configuration, a part of the heat in the heat radiation block 150 transferred from the LED unit 2 is efficiently radiated through the reflective plate 110. In this configuration, the reflective plate 110 also serves as a heat radiating element. In this configuration, the heat radiation block 150 may be formed in a small size, it leads to reduce the weight and the cost. The reflective plate 110 may be made of Al. Fabricating the reflective plate 110 by Al makes it possible to have higher thermal conductivity compared with the case that the reflective plate is formed of steel plate. As a result, the heat generated in the LED unit 2 is efficiently dissipated.

In the lighting apparatus of this embodiment, the LED unit 2 is attached/detached to the heat radiation block 150 under the condition that the reflective plate 110 is attached to the main body 100. In other words, the LED unit 2 is attached/detached without removing the reflective plate 110 from the main body 100. As a result, the LED unit 2 is easily replaced. In addition, in case that one of the lighting units 1 may be broken down, the LED module 2*a* including this lighting unit 1 can be replaced instead of replacing the entire LED unit 2. It leads to reduce the cost.

The lighting apparatus of this embodiment includes the light transmissive cover 180 covering the LED unit 2 and the surrounding area of the installation portion 115 in the reflective plate 110. The light transmissive cover 180 is detachably attached to reflective plate 110. As a result, the LED unit 2 is protected by attaching the light transmissive cover 180. In addition, the light transmissive cover 180 can be detached from the reflective plate 110 in order to replace the LED module 2*a* or the LED unit 2. The light transmissive cover 180 may be formed to have light diffusion property of diffusing the light emitted from the LED unit 2. This configuration enables to illuminate the reflective surface 110*a* of the reflective plate 110 uniformly. The light diffusion property of the light transmissive cover 180 may be realized by containing a light diffusion material in the base material of the light transmissive cover 180.

The lighting apparatus of this embodiment has the main body 100 and the adapter 150 having almost same structures with those of the lighting apparatus for the conventional straight tube fluorescent lamp. The lighting apparatus of this embodiment is easily installed as similar with the conventional one. The reflective plate 110 may be formed to have the same size or shape with that of the conventional lighting apparatus. This configuration enables to replace the lighting apparatus of this embodiment with the conventional lighting apparatus. That is, the lighting apparatus of this embodiment may be installed in the existing installation hole 301 of the ceiling 300 which is formed in advance for installing the conventional lighting apparatus. As a result, there is no need to form another installation hole 301 at the ceiling 300.

The LED unit 2 is not always composed of a plurality of the LED modules 2a. That is, the LED unit 2 may include single basal plate 4 and single circuit board 3. In this configuration, all the LED chips 10 may be connected in series between the first contact terminal 5a1 and the second contact terminal 5a2 of the male connector 5a by means of the circuit pattern 3b. In this embodiment, a plurality of the lighting units 1 is connected in series. However, the relation of connection of the lighting units 1 is not limited particularly. The lighting units 1 may be connected parallel to one another, or may be connected properly combining the series connections and the parallel connections.

In this embodiment, the LED unit 2 is detachably attached to the heat radiation block 150 by the attachment screws 8 (refer to FIG. 1B) as described above. However, the LED unit 2 may be attached by using another means, such as a plate spring 118 (refer to FIG. 8B) formed by bending a rectangular metal plate. In the illustrated example shown in FIG. 8A, the basal plate 4 has the longer length in the lateral direction of the LED unit 2 than that of the circuit board 3. Upper part (lower half in FIG. 8A) of the adjusting piece 116 (which is the closer side to the heat radiation block 150) is formed in a L-shape in the cross section so that the distance between the facing parts of the upper part of the adjusting piece 116 is longer than the distance between that of the lower part, in the lateral direction of the LED unit 2. In other words, the adjusting piece 116 is formed so that the width distance (between facing parts) of the adjusting piece 116 in which the basal plate 4 is disposed is set to be longer than the lateral length of the basal plate 4. Also, the adjusting piece 116 is formed so that the width distance (between facing parts) of the adjusting piece 116 in which the circuit board 3 is disposed is set to be longer than the lateral length of the circuit board 3 as well as shorter than the lateral length of the basal plate 4. As a result, the LED unit 2 is supported by the heat radiation block 150 and the reflective plate 110.

The plate spring 118 made of metal includes a fixed portion 118a at its center in the longitudinal direction. In the illustrated example shown in FIG. 8A, the fixed portion 118a is fixed, by way of such as spot welding, to the facing surface of the upper part (lower part in FIG. 8A) of first part of the adjusting piece 116 (left part in FIG. 8A). Herein, the facing surface of the upper part of the first part of the adjusting piece 116 faces to the upper part of the second part of the adjusting piece 116 (right part in FIG. 8A). The plate spring 118 includes contact portions 118b in the longitudinal both ends. The contact portion 118b is arranged so as to apart from the adjusting piece 116 and contact with the lateral side surface of the basal plate 4. In the plate spring 118, the fixed portion 118a and the contact portion 118b is continuously coupled with a V-shaped coupling portion 118c. A heat radiation sheet (thermal conduction sheet) 93 formed of a rubber sheet such as Sarcon (registered trademark) is interleaved between the LED unit 2 and the heat radiation block 150 in order to minimize the ununiformity in the thermal resistance between the LED unit 2 and the heat radiation block 150. The LED unit 2 and the heat radiation block 150 are thus thermally coupled to each other through the heat radiation sheet 93.

In the configuration of FIG. 8A, the LED unit 2 (LED module 2a) may be attached to the heat radiation block 150 by the following steps of: inserting the basal plate 4 of the LED unit 2 into the installation portion 115 in an inclined condition with respect to the horizontal surface; making contact the side surface of the basal plate 4 with the contact portion 118b of the plate spring 118 fixed to the first part of the adjusting piece 116; pushing the LED unit 2 so as to make the plate spring 118 elastically deform; and pushing the LED unit 2 into the heat radiation block 150 direction, thereafter the other side surface of the basal plate 4 is forced to contact with the second part of the adjusting piece 116 by the elastic force of the plate spring 118. The LED unit 2 may be detached by the following steps of: pushing the LED unit 2 toward the plate spring 118; inclining the LED unit 2 with respect to the horizontal surface; and getting out the LED unit 2. Note that, the circuit board 3 and/or the basal plate 4 may be provided with a jig insertion section (such as hole or notch) for inserting such as the tip of a flat-blade screwdriver. With this configuration, the LED unit 2 can be easily pressed toward the plate spring 118 by using the jig. As a result, it allows to reduce the acting force to the circuit board 3 during the detachment.

A pair of plate springs 119 (refer to FIG. 9A) may be used for detachably attaching the LED unit 2 to the heat radiation block 150, as substitute for the above means. Also in the illustrated example shown in FIG. 9A, the basal plate 4 has the longer length in the lateral direction of the LED unit 2 than that of the circuit board 3.

The plate spring 119 is formed by bending a rectangular metal plate. The plate spring 119 includes a fixed portion 119a, a J-shaped contact portion 119b, and an inverted V-shaped coupling portion 119c. The fixed portion 119a is configured to be fixed to the abovementioned upper part of the adjusting piece 116 by way of such as spot welding. The contact portion 119b is configured to elastically contact with the circumferential part of the basal plate 4 of the LED unit 2. The fixed portion 119a and the contact portion 119b are continuously coupled with the coupling portion 119c. The adjusting piece 116 of the reflective plate 110 is formed with a U-shaped recess in the planar view at the portion to which the plate spring 119 is disposed in order to minimize the gap between the abovementioned flat portion of the LED unit 2 and the reflective surface 110a of the reflective plate 110. In the configuration of FIG. 9A, the LED unit 2 may be attached to the heat radiation block 150 by the following steps of: elastically deforming the plate springs 119 (which are arranged along the lateral direction of the LED unit 2) by such as fingers so as to increase the interval between the tips of the contact portions 119b; inserting the basal plate 4 of the LED unit 2 into the installation portion 115 in an inclined condition with respect to the horizontal surface; and pushing the LED unit 2 toward the heat radiation block 150. The LED unit 2 may be detached by the following steps of: elastically deforming the plate springs 119 (which are arranged along the lateral direction of the LED unit 2) by such as fingers so as to increase the interval between the tips of the contact portions 119b; inclining the LED unit 2 with respect to the horizontal surface; and getting out the LED unit 2.

Figure 10:
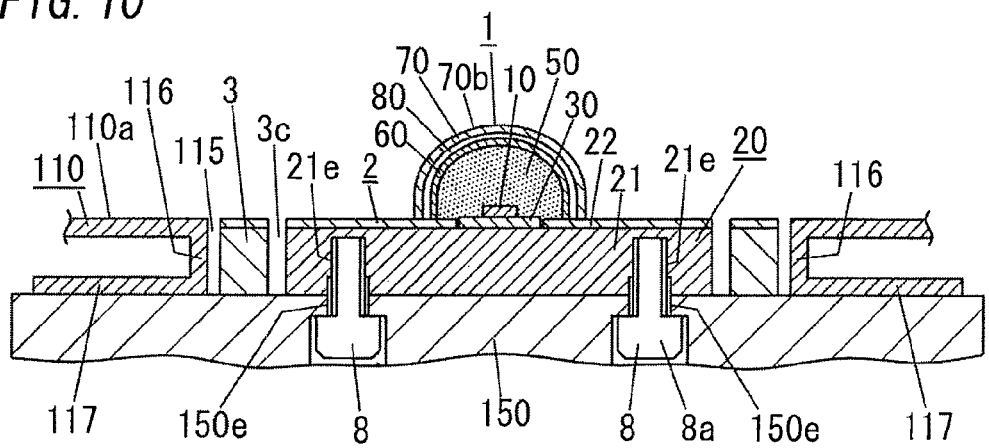
FIG. 10 shows a detail schematic side cross sectional view of an another configuration of the lighting apparatus of the above.
Figure 11:
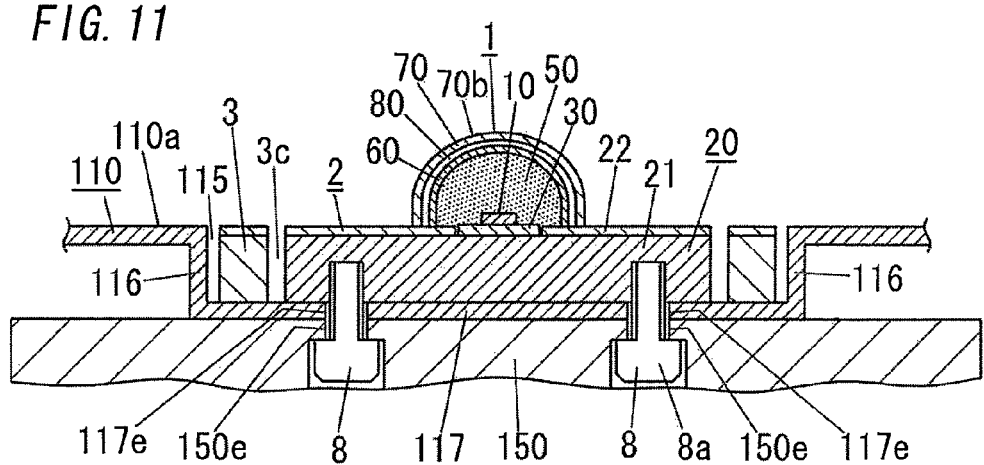
FIG. 11 shows a detail schematic side cross sectional view of an another configuration of the lighting apparatus of the above.

The LED unit 2 may be attached to the heat radiation block 150 by use of another configuration. For example, the heat radiation block 150 may be provided with a through hole 150e for inserting the attachment screw 8 and the heat conducting plate 21 may be provided with a screw hole 21e for screwing with the attachment screw 8, as shown in FIG. 10. In further another configuration shown in FIG. 11 which is obtained by modifying the configuration of FIG. 10, the first and the second parts of the adjusting piece 116 are integrally coupled through the contact piece 117 which contacts to the heat radiation block 150. In this configuration, the LED chip 2 is attached to the heat radiation block 150 so that the abovementioned other surface of the LED chip 2 closely-contacts to the contact piece 117 of the reflective plate 110. In the configuration of FIG. 11, the contact piece 117 is provided with a through hole 117e for inserting the attachment screw 8.

Figure 12:
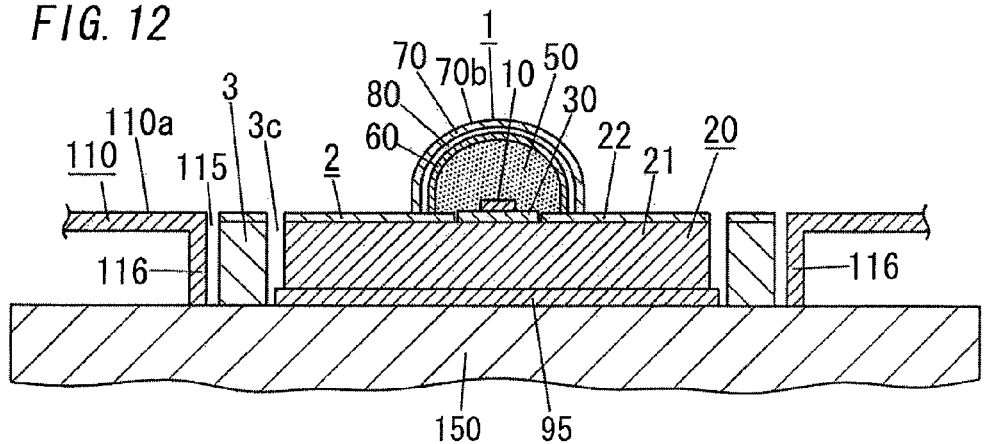
FIG. 12 shows a detail schematic side cross sectional view of an another configuration of the lighting apparatus of the above.
Figure 13:
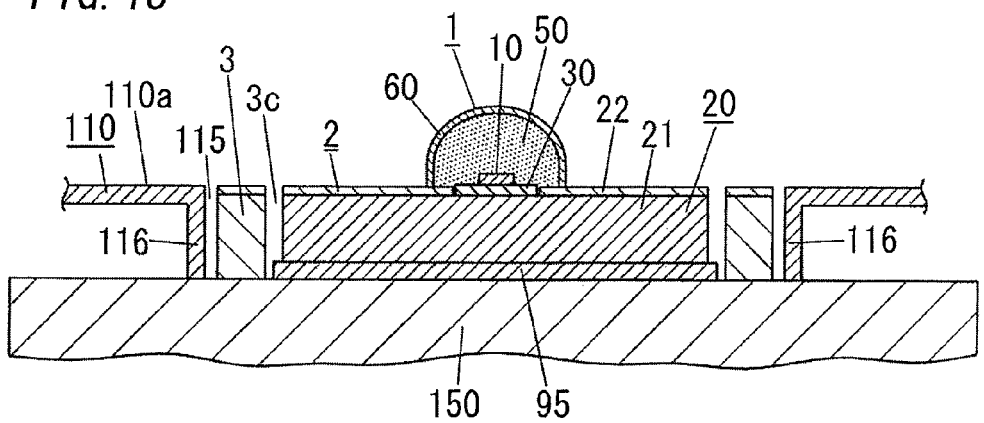
FIG. 13 shows a detail schematic side cross sectional view of an another configuration of the lighting apparatus of the above.

As shown in FIG. 12, the reflective plate 110 may not be provided with the contact piece 117. In this case, the heat reflective plate 110 is not likely to serve as the heat radiation element. In further another configuration, the LED chip 10 may be configured to emit white light by itself. Also, the sealing member 50 may be included a phosphor thereinside. In such the cases, the lighting unit 1 may not be provided with the color conversion member 70 as shown in FIG. 13. In the configuration shown in FIG. 12 or 13, the heat conducting plate 21 is bonded to the heat radiation block 150 through an insulation layer 95 formed of the organic green sheet. The heat conducting plate 21 and the heat radiation block 150 are thus electrically insulated and thermally coupled to each other.

The above mentioned example uses the blue-color LED as the LED chip 10, and uses the SiC substrate as the substrate for crystal growth. GaN substrate or a sapphire substrate may be used as the substrate for crystal growth instead of the SiC substrate. Using SiC substrate or GaN substrate as the substrate for crystal growth allows to give higher thermal conductivity and lower thermal resistance compared with a sapphire substrate which is an insulating body. In the LED chip 10 of the abovementioned example, the anode is provided on the abovementioned one surface of the LED chip 10, and the cathode is provided on the abovementioned the other surface thereof. However, the LED chip 10 is not limited in this configuration, and both of the anode and the cathode may be formed on the abovementioned one surface side of the LED chip 10. In this configuration, each of the anode and the cathode may be bonded directly to the corresponding patterned conductor 23 through the bonding wire 14. The LED chip 10 is not limited to the blue-color LED, and may be configured to emit purple light or ultraviolet light.

The sub-mount member 30 may be omitted if the difference of linear expansion coefficient between the LED chip 10 and the heat conducting plate 21 is comparatively small. In the lighting unit 1 of this embodiment, the LED chip 10 has the chip size of 1 mm square, and a single LED chip 10 is disposed on the sub-mount member 30. However, the chip size of the LED chip 10 and/or the number of the LED chip 10 is not limited in this configuration. For example, the LED chip 10 may have the chip size of 0.3 mm square. Also, a plurality of the LED chips 10 may be disposed on a single sub-mount member 30. The plurality of LED chips 10 may be connected in series through bonding wires (not shown in the figures) and patterned conductors provided on the sub-mount member 30.

Figure 14:
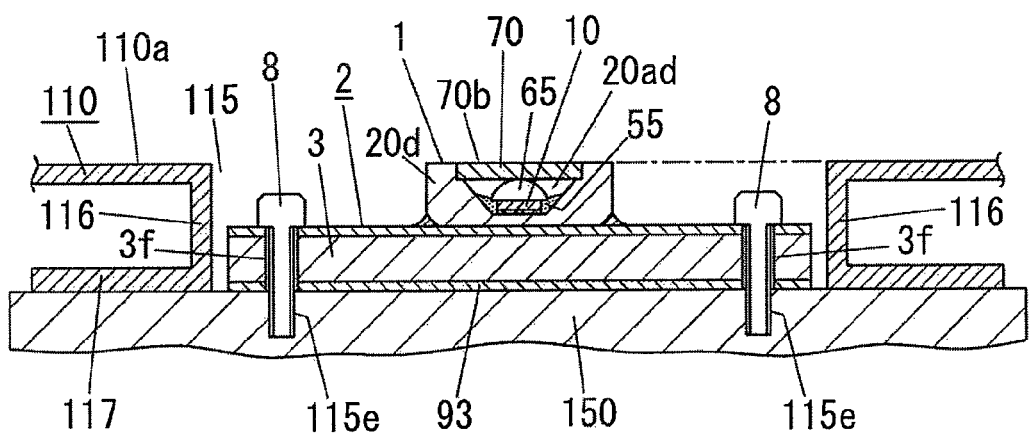
FIG. 14 shows a detail schematic side cross sectional view of an another configuration of the lighting apparatus of the above.

The LED unit 2 may have different configuration with the above examples. As shown in FIG. 14, the LED unit 2 may include a circuit board 3 formed of a metal-based printed-wiring board and a plurality of surface-mounted lighting units 1 mounted on the circuit board 3.

In the illustrated example shown in FIG. 14, the circuit board 3 is attached to the heat radiation block 150 through the attachment screw 8. As shown in FIG. 14, the circuit board 3 is formed with a through hole 3f for inserting the attachment screw 8, and the heat radiation block 150 is formed with a screw hole 115e for screwing with the attachment screw 8. The heat radiation sheet (thermal conduction sheet) 93 formed of a rubber sheet such as Sarcon (registered trademark) is interleaved between the LED unit 2 and the heat radiation block 150 in order to minimize the ununiformity in the thermal resistance between the LED unit 2 and the heat radiation block 150. The LED unit 2 and the heat radiation block 150 are thus thermally coupled to each other through the heat radiation sheet 93.

The lighting unit 1 illustrated in FIG. 14 includes the LED chip 10, a mounting substrate 20d on which the LED chip 10 being mounted, a hemispherical optical member 65 disposed over the LED chip 10, and the color conversion member 70. The optical member 65 of this example is made of silicone resin, but not limited in the silicone resin. The optical member 65 may be made of other material such as glass. The optical member 65 has a closer refractive index to the material of the light extracting surface of the LED chip 10 compared with the air, thereby the optical member 65 can reduce the difference of refractive index between the LED chip 10 and the medium which contacts with the light extracting surface of the LED chip 10 compared with the case that the medium is air. As a result, the light extraction efficiency from the LED chip 10 is improved.

The mounting substrate 20d is formed of a ceramic substrate. The mounting substrate 20d is provided with a storage recess 20ad for storing the LED chip 10, and conductors (not shown in the figures) to which the anode (not shown in the figures) and the cathode (not shown in the figures) is electrically connected through a bump, respectively. In short, the LED chip 10 is mounted on the mounting substrate 20d through flip chip-bounding. The light is extracted through a sapphire substrate which is a substrate for crystal growth. The storage recess 20ad of the mounting substrate 20d is formed to have a circular shaped opening, and the dimension of the opening becomes gradually small toward the inner bottom surface thereof. A sealing member 55 formed of a sealing material (such as silicone resin) is provided in the storage recess 20ad of the mounting substrate 20d. The LED chip 10 is sealed with the sealing member 55. Also, the optical member 65 is bonded to the mounding substrate 20d through this sealing material.

The color conversion member 70 of this example is formed in a sheet shape. The color conversion member 70 is hermetically bonded to the mounting substrate 20d so as to enclose the optical member 65. The package of the lighting unit 1 is composed of the mounting substrate 20d and the color conversion member 70. The light emitting surface 70b of the color conversion member 70 composes the flat portion at the light extracting surface from the lighting unit 1.

As explained above, the lighting apparatus of this invention includes the LED unit 2, the main body 100, the reflective plate 110, the lighting device 120, and the heat radiation block 150. The LED unit 2 is formed in an elongated shape. The LED unit 2 is provided at its one surface in the thickness direction with the plurality of lighting units 1. In other words, the LED unit 2 is provided at first surface in the thickness direction with the plurality of lighting units 1. Each of the lighting unit 1 has the LED chip 10. The reflective plate 110 is made of metal. The reflective plate 110 is held by the main body 100. The reflective plate 110 is configured to control the light from the LED unit 2 so as to be an intended distribution. The lighting device 120 is replaceably attached to the main body 100. The lighting device 120 is configured to light (activate) the LED unit 2. The heat radiation block 150 is arranged at the other surface side in the thickness direction of the LED unit 2. In other words, the heat radiation block 150 is arranged at second surface in the thickness direction of the LED unit 2. The second surface is opposite side to the first surface in the LED unit 2. The LED unit 2 is replaceably attached to the heat radiation block 150. The heat radiation block 150 is configured to dissipate the heat generated in the LED unit 2. The reflective plate 110 has the installation portion 115. The installation portion 115 is formed in order to install the LED unit 2 therein. The heat radiation block 150 is held by the reflective plate 110. The LED unit 2 has the "light extracting surface from the lighting unit 1". The light extracting surface has the flat portion. The flat portion is in the same plane with the surrounding area of the installation portion 115 in the reflective surface 110a.

In detail, the reflective surface 110a has a reflecting portion. The reflecting portion is formed around the installation portion 115. In other words, the reflecting portion is provided around the outer circumference of the installation portion 115. The flat portion is in the same plane with the reflecting portion.

In this configuration, the reflective plate 110 has an installation portion 115, to which the LED unit 2 being installed, formed to be opened in a shape corresponding to the outer circumference shape of the LED unit 2. The heat radiation block 150 is held by the reflective plate 110. This configuration enables to use the heat radiation block 150 with larger size. As a result, the heat generated in the lighting unit 1 is efficiently dissipated through the heat radiation block 150. As a result, the lighting apparatus is increased its light output by preventing the temperature increase of the LED chip 10. In addition, the lighting apparatus of this embodiment is configured so that the LED unit 2 has the flat portion at the light extracting surface from the lighting unit 1, and the flat portion has the same plane with the surrounding area of the installation portion 115 in the reflective surface 110a of the reflective plate 110. This configuration enables to prevent the shade in the area around the lighting unit 1.

As shown in each figures, the reflective plate 110 has the installation portion 115 configured to be installed therein the LED unit 2. The installation portion 115 is formed to be opened in a shape corresponding to the outer circumference shape of the LED unit 2.

In other words, the installation portion 115 has a predetermined shape. The predetermined shape of the installation portion 115 is formed so that the LED unit 2 is disposed inside the installation portion 115.

The opening of the installation portion 115 is penetratingly provided in the thickness direction of the reflective plate 110.

The LED unit 2 is configured so as to be detachably attached to the heat radiation block 150 without removing the reflective plate 110 from the main body 100. The abovementioned the other surface (the second surface) of the LED unit 2 surface contacts with the heat radiation block 150. It leads to improve the heat radiation property.

Figure 2:
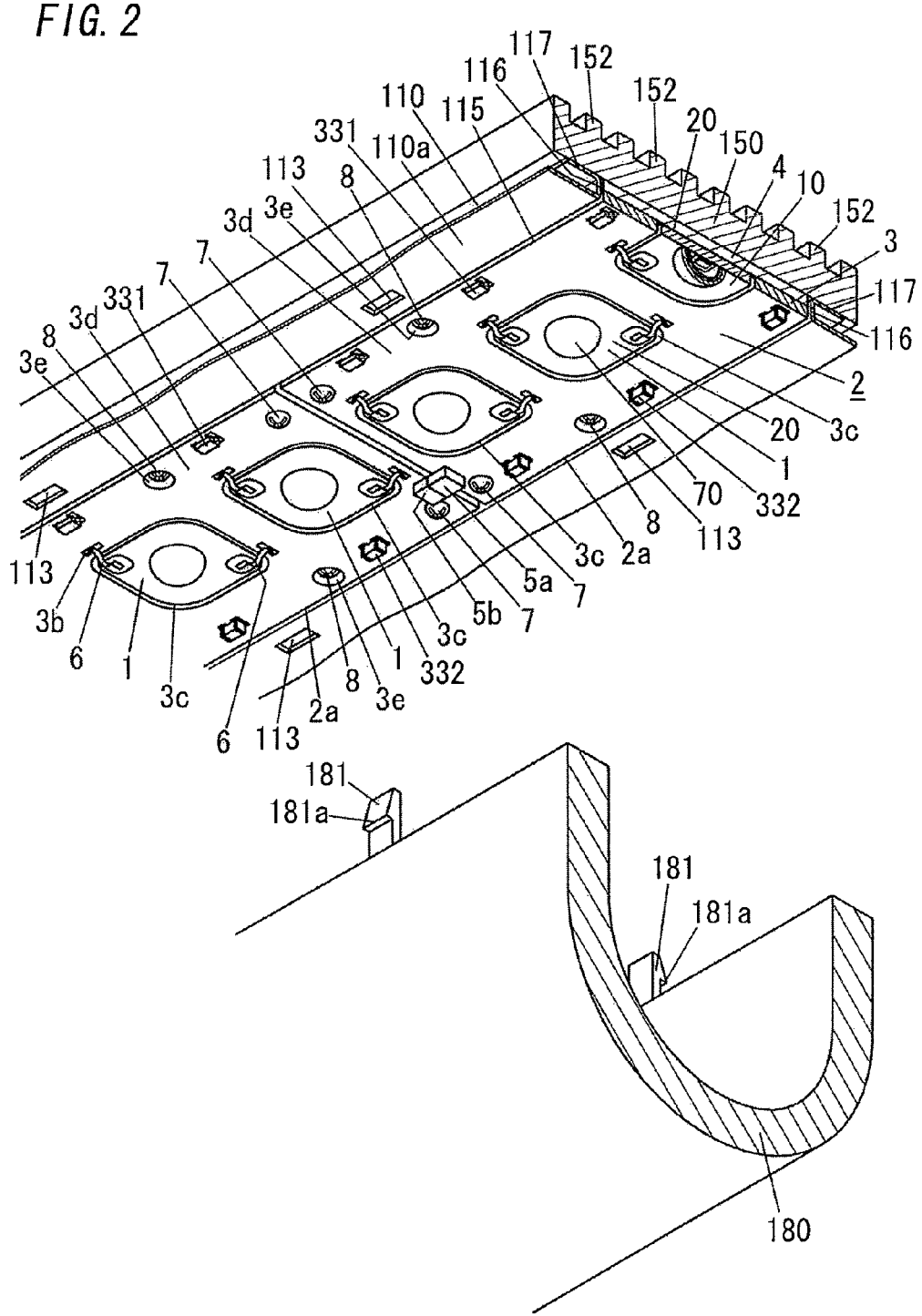
FIG. 2 shows a detail schematic exploded perspective view with cutaway of the lighting apparatus of the above.

As shown in FIGS. 1, 2, the lighting apparatus includes the light transmissive cover 180 having a gutter shape. The light transmissive cover 180 is detachably attached to the reflective plate 110 so as to cover the LED unit 2 and the surrounding area of the installation portion 115 in the reflective plate 110.

In other words, abovementioned reflecting portion is defined by the area covered by the light transmissive cover 180.

As shown in each figures, the reflective plate 110 has a first height. The first height is defined along with the thickness direction of the LED unit 2. The first height of the reflective plate 110 is set so that the flat portion at the light extracting surface from the lighting unit 1 defined in the LED unit 2 is in the same plane with the surrounding area of the installation portion 115 defined in the reflective surface 110a of the reflective plate 110.

The reflective plate 110 has the adjusting piece 116. The adjusting piece 116 extends from the reflective plate 110 toward the heat radiation block 150. The adjusting piece 116 extends from the reflective plate 110 along the thickness direction of the LED unit 2. The adjusting piece 116 has the first height in the thickness direction of the LED unit 2. Thereby, the height of the reflective plate 110 is determined by the adjusting piece 116. The first height of the adjusting piece 116 is set so that the flat portion at the light extracting surface from the lighting unit 1 in the LED unit 2 is in the same plane with the surrounding area of the installation portion 115 in the reflective surface 110a of the reflective plate 110.

The LED unit 2 has a first thickness in the thickness direction of the LED unit 2. The first height and the first thickness are set so that the flat portion at the light extracting surface from the lighting unit 1 in the LED unit 2 is in the same plane with the surrounding area of the installation portion 115 in the reflective surface 110a of the reflective plate 110.

As shown in each figures, the heat radiation block 150 has a planar surface. The reflective plate 110 and the LED unit 2 are attached to the planar surface of the heat radiation block 150. The first thickness is set to be same with the first height.

This configuration makes it possible to prevent the area around the lighting unit 1 from being shaded.

As shown in FIGS. 1, 2, 3, 8, 9, 10, and 14, the adjusting piece 116 has the contact piece 117. The contact piece 117 extends in the direction intersecting with the thickness direction of the LED unit 2. The contact piece 117 surface contacts with the heat radiation block 150.

In detail, the adjusting piece 116 has the contact piece 117. The contact piece 117 extends in the direction orthogonal to the thickness direction of the LED unit 2. The contact piece 117 surface contacts with the heat radiation block 150.

With this configuration, a part of the heat in the heat radiation block 150 transferred from the LED unit 2 is efficiently radiated by the reflective plate 110. In this configuration, the reflective plate 110 also serves as a heat radiating element. In this configuration, the heat radiation block 150 may be formed in a small size, it leads to reduce the weight and the cost.

As shown in FIGS. 1, 2, 3, 8, 9, 10, and 14, the contact piece 117 extends from the adjusting piece 116 into the opposite side with respect to the LED unit 2.

The adjusting piece 116 has a first end at its one end in the height direction. The contact piece 117 extends from the first end of the adjusting piece 116 into the opposite side with respect to the LED unit 2.

The contact piece 117 rises in temperature when the heat is transferred from the heat radiation block 150 to the contact piece 117. The contact piece 117 expands with increase in temperature of the contact piece 117. In this configuration however, the contact piece 117 extends into the opposite side to the LED unit 2. As a result, the contact piece 117 expands into the opposite side to the LED unit 2 due to rise in temperature of the contact piece 117. In other words, the contact piece 117 does not expand toward the LED unit 2. This configuration enables to maintain the gap between the reflective plate 110 and the LED unit 2 constant. That is, even in the configuration having a narrow gap between the reflective plate 110 and the LED unit 2, the contact piece 117 does not come into contact with the LED unit 2 due to the expansion of the contact piece 117. As a result, even in the configuration having the narrow gap between the reflective plate 110 and the LED unit 2, the contact piece 117 does not apply a pressure upon the LED unit 2 caused by the expansion of the contact piece 117.

As shown in FIG. 10, the reflective plate 110 has a depressed portion. The depressed portion has a shape corresponding to the outer circumference shape of the LED unit 2. The depressed portion is configured so that the LED unit 2 is installed therein. The depressed portion defines the installation portion 115.

The installation portion 115 has a peripheral wall and a bottom wall. The peripheral wall is defined as the adjusting piece 116. The bottom wall is defined as the contact piece 117. The LED unit 2 contacts with the heat radiation block 150 through the bottom wall.

The lighting unit 1 has the LED chip 10, mounting substrate 20, and an optical component. The LED chip 10 is mounted on the one surface of the mounting substrate 20. The optical component is secured to the one surface of the mounting substrate 20 so as to house the LED chip 10 therein together with the mounting substrate 20. The optical component has an outer peripheral edge. The outer peripheral edge of the optical component is secured to the one surface of the mounting substrate 20. The flat portion at the light extracting surface is defined as the area outside than the outer peripheral edge.

The optical component includes the optical member 60. The optical member 60 is configured to control the distribution of the light emitted from the LED chip 10. The optical member 60 is secured to the one surface of the mounting substrate 20 so as to house the LED chip 10 together with the mounting substrate 20. The optical member 60 has a dome shape.

The optical component further includes the color conversion member 70. The color conversion member 70 includes the phosphor and the light transmissive material. The phosphor is excited by the light which is emitted from the LED chip 10, and to emit the light of a color different from the emission color of the LED chip 10. The color conversion member 70 is disposed on the abovementioned one surface of the mounting substrate 20, so as to form the air layer being interposed between the optical member 60 and the color conversion member 70. The color conversion member 70 has a dome shape.

Figure 9:
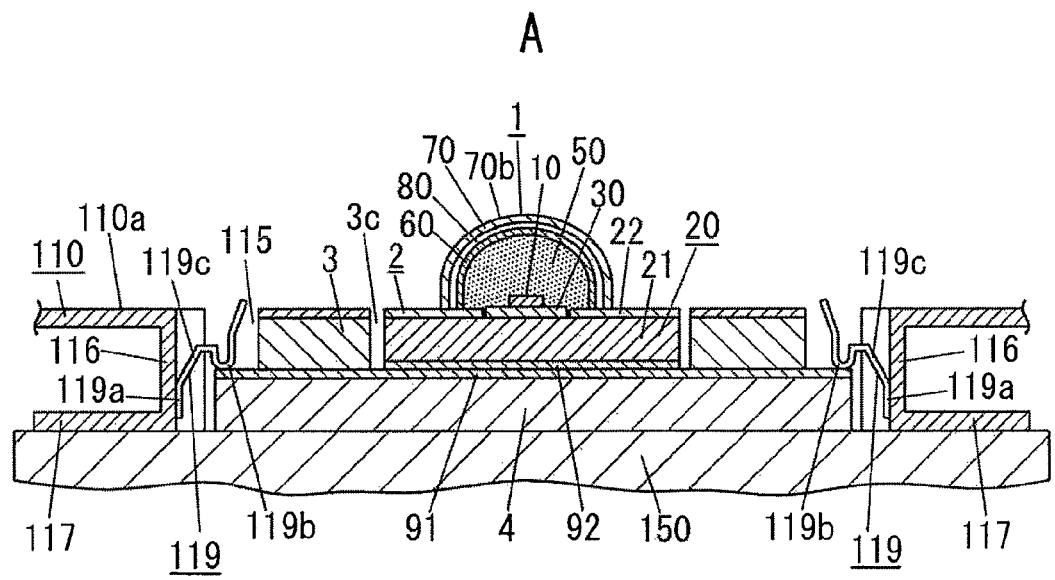
FIG. 9A shows a detail schematic side cross sectional view of an another configuration of the lighting apparatus of the above.
FIG. 9B shows a perspective view of the attachment spring in FIG. 9A.
Figure 9:
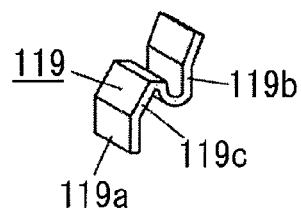

As shown in FIG. 9, the lighting apparatus includes an attachment means. The LED unit 2 is attached with respect to the heat radiation block 150 through the attachment means.

The attachment means is composed of a spring. The spring is arranged so as to bias the LED unit 2 towards the heat radiation block 150.

As shown in FIG. 9, the spring is composed of a plate spring 119. The plate spring 119 has a first portion (coupling portion 119c) extending from the peripheral edge toward inside of the peripheral edge. As a result, the LED unit 2 is interposed between the first portion of the plate spring 119 and the heat radiation block 150.

The LED unit 2 therefore is easily attached to the heat radiation block 150. Moreover, this configuration makes it possible that the LED unit 2 is attached so as to be closely contact to the heat radiation block 150.

As shown in FIG. 9, the plate spring 119 further has a second portion (contact portion 119b). The second portion extends from the first portion into the opposite side with respect to the heat radiation block 150. The second portion is located between the LED unit 2 and the reflective plate 110.

This configuration makes it possible to easily detach the LED unit 2 from the heat radiation block 150.

Figure 8:
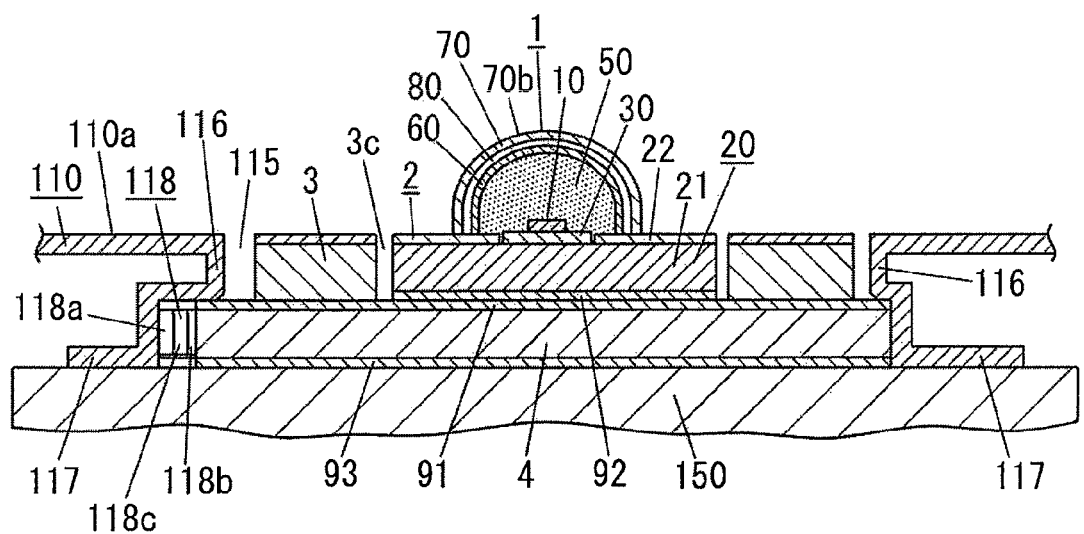
FIG. 8A shows a detail schematic side cross sectional view of an another configuration of the lighting apparatus of the above.
FIG. 8B shows a perspective view of the attachment spring in FIG. 8A.
Figure 8:
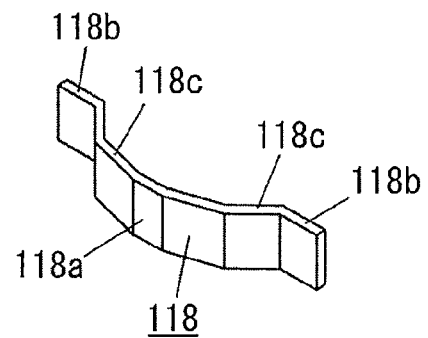

As shown in FIG. 8, the lighting apparatus includes an attachment means. The LED unit 2 is made contact with the reflective plate 110 through the attachment means. The installation portion 115 has a peripheral edge. The peripheral edge has a first side inner surface and a second side inner surface. The second side inner surface is opposite to the first inner surface. The attachment means is arranged on the first side inner surface. The LED unit 2 is held by the attachment means and the second side inner surface so that the LED unit 2 makes contact with the second side inner surface of the reflective plate 110.

This configuration enables to dissipate the heat generated in the LED unit 2 through the heat radiation block 150 and the reflective plate 110.

As shown in FIG. 8, the attachment means is composed of a spring 118. The spring 118 is configured to bias the LED unit 2 towards the second side inner surface, thereby the LED unit 2 makes contact with the second side inner surface of the reflective plate 110.

With this configuration, the plate spring 118 allows to reduce the acting force caused by the thermal expansion of the LED unit 2 or reflective plate 110.

The surrounding area of the installation portion in the reflective surface of the reflective plate is defined as a surface parallel to the flat portion at the light extracting surface from the lighting unit in the LED unit.

The surrounding area of the installation portion in the reflective surface of the reflective plate is defined in an area inside the light transmissive cover.

Second Embodiment

Figure 15:
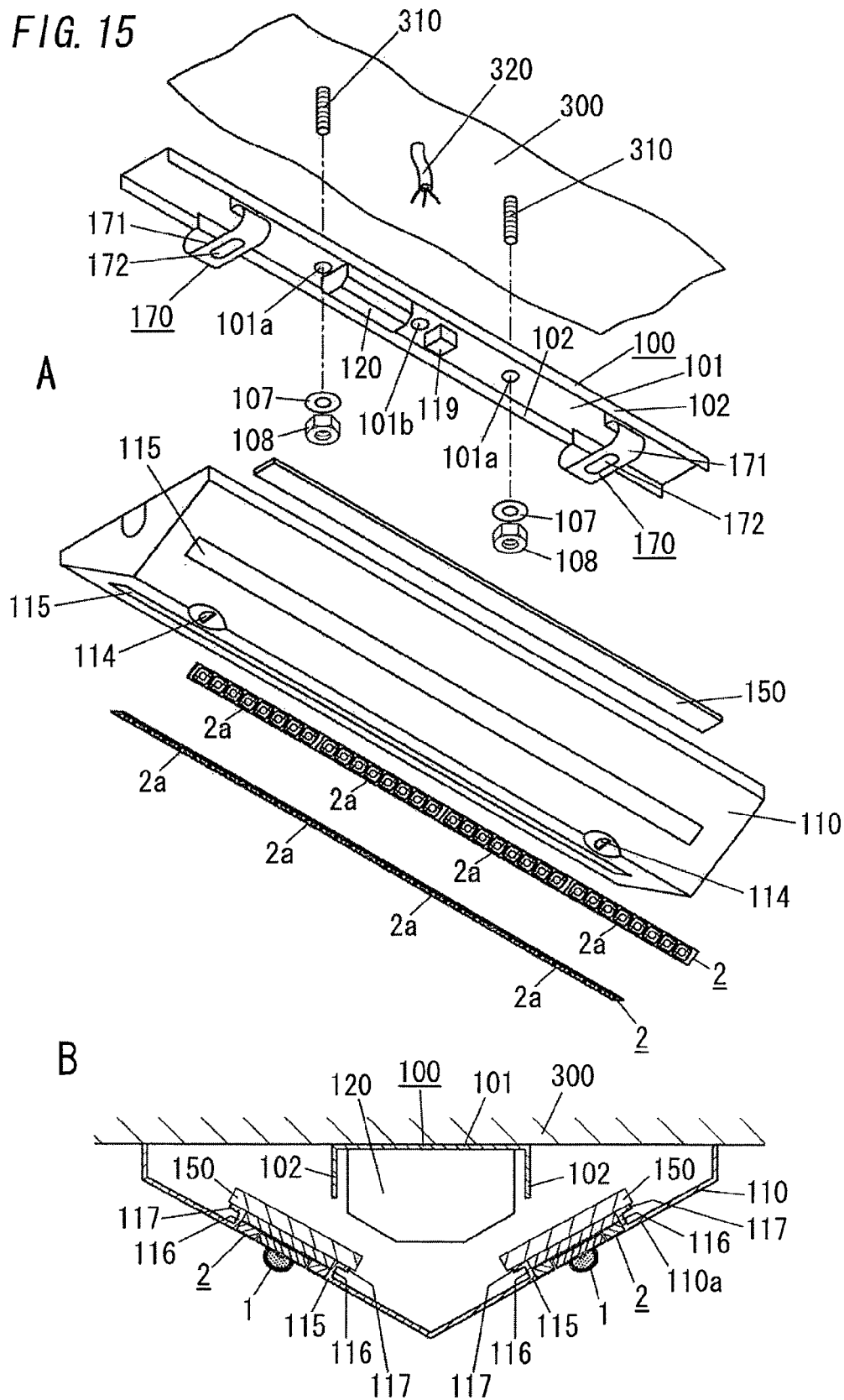
FIG. 15A shows a schematic exploded perspective view of the lighting apparatus of the second embodiment.
FIG. 15B shows a detail schematic side cross sectional view of the lighting apparatus of the second embodiment.
Figure 16:
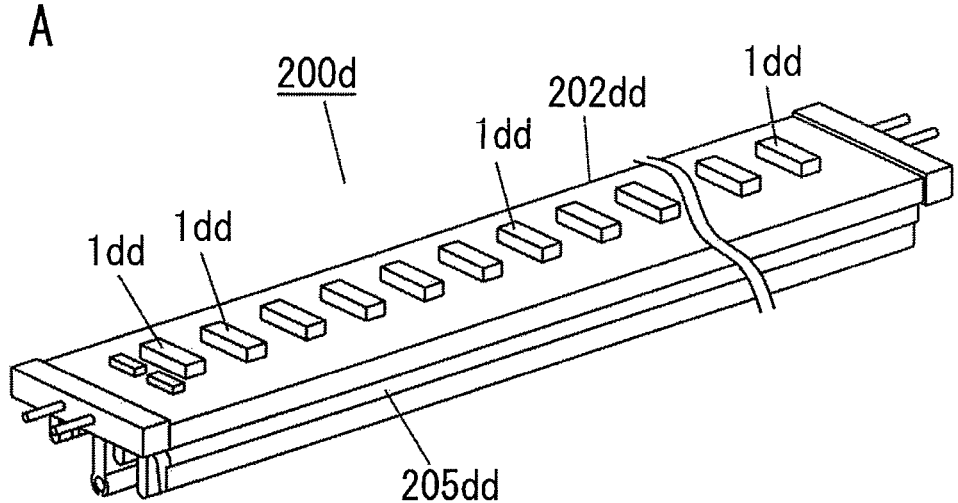
FIG. 16A shows a detail schematic perspective view of the prior LED lamp.
FIG. 16B shows a schematic side cross sectional view of the prior LED lamp.
Figure 16:
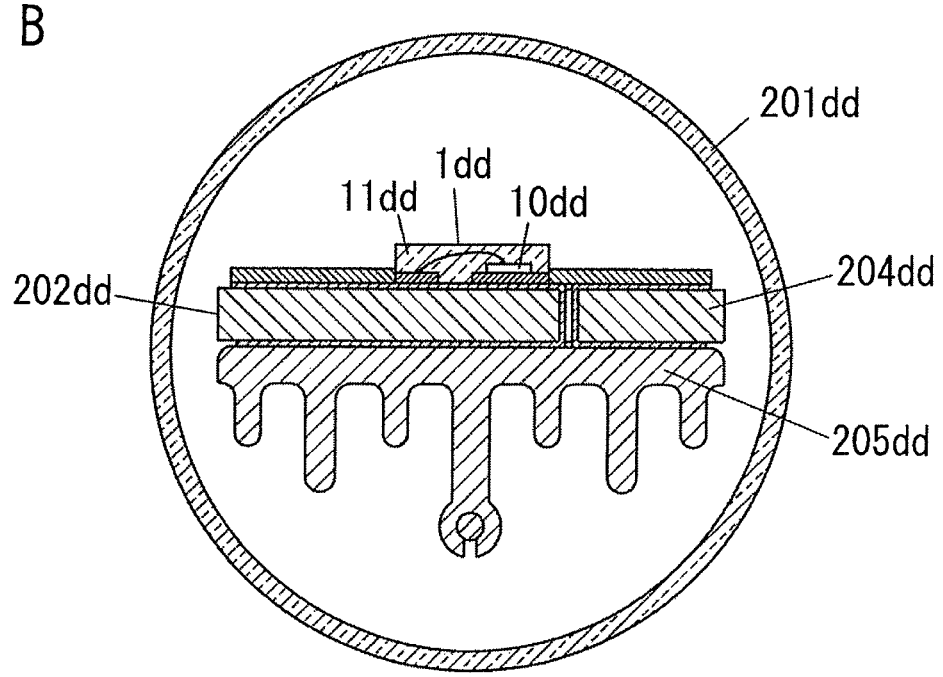

The second embodiment discloses the lighting apparatus which is adapted to be directly mounted to the ceiling, as shown in FIG. 15. The illumination apparatus includes the main body 100, adapters 170, the reflective plate 110, and two LED units 2. The main body 100 has a U-shape to be opened to a lower direction in the side cross section. The main body 100 is mounted to a construction surface composed of a lower surface of the ceiling 300. The adapter 170 is provided at each ends in the longitudinal direction of the main body 100. The reflective plate 110 has a V-shape in the side cross section. The reflective plate 110 is attached to the adapters 170 so as to cover the main body 100. Each the LED units 2 is held by the reflective plate 110. Each of the LED unit 2 is provided with the heat radiation block 150 which is explained in the first embodiment. The lighting apparatus of this embodiment is formed in a mountain-shape (trapezoid shape in the cross section). The lighting apparatus of this embodiment is different in the shapes of the reflective plate 110 and the adapter 170 from the first embodiment. Similar components explained in the first embodiment are designated by like reference numerals, and will not be explained in detail.

The main plate 101 of the main body 100 is formed with the two bolts insert holes 101a as similar with the first embodiment. Therefore, according to inserting the mounting bolts 310, which are provided protrudingly from the construction surface, into the bolt insert holes 101a and fastening the mounting bolts 310 to nuts 108 with the washer 107 therebetween, the main body 100 is joined to the mounting bolts 310, thereby the main body 100 is attached to the ceiling.

The lighting device 120 of this embodiment is connected to each of the LED unit 2 so as to light the each of the LED unit 2. In short, the lighting device 120 of this embodiment is provided with two of the terminal arrangement 147 (refer to FIG. 7) explained in the first embodiment.

The adapter 170 is formed by bending a rectangular metal plate. The adapter 170 has an attaching piece 171 configured to face to the main plate 101 when the adapter 170 is attached to the main body 100. The attaching piece 171 is formed with an engaging hole 172 having an elongated hole shape for engaging a latch member 114. Herein, the latch member 114 is rotatably provided at the top of the reflective plate 110. The adapter 170 is attached to the main body 100 by attaching each ends thereof to each of side plates 102 of the main body 100 so that the longitudinal direction of the attaching piece 171 is orthogonal to the longitudinal direction of the main plate 101. The engaging hole 172 is formed so that the longitudinal direction thereof coincides with the longitudinal direction of the attaching piece 171. The reflective plate 110 may be attached/detached to the adapter 170 by appropriately rotating the latch members 114.

Two of the LED units 2 are arranged at the reflective plate 110 in a manner that the top of the reflective plate 110 is located therebetween. Two of the LED units 2 are arranged so that the longitudinal directions thereof are parallel to each other.

The lighting apparatus of this embodiment explained above makes it possible to prevent the temperature increase of the LED chip 10 and to increase the light output, as similar to the first embodiment. In addition, this embodiment makes it possible to prevent the area around the lighting unit 1 from being shaded, as similar to the first embodiment.

The number of the LED unit 2 and the shape of the reflective plate 110 are not limited to the above embodiments.

REFERENCE SIGNS LIST

1 lighting unit
2 LED unit
2a LED module
3 circuit board
3b circuit pattern
3c opening window
3d mirror
4 basal plate
10 LED chip
20 mounting substrate
21 heat conducting plate
22 printed circuit plate
23 patterned conductor
24 exposure opening
30 sub-mount member
50 sealing member
60 optical member
70 color conversion member
80 air layer
100 main body
110 reflective plate
110a reflective surface
115 installation portion
120 lighting device
150 heat radiation block
180 light transmissive cover

The invention claimed is:

1. A lighting apparatus comprising:
   an LED unit formed in an elongated shape, said LED unit being provided with a plurality of lighting units on one surface in the thickness direction thereof, each of said lighting units having a LED chip;
   a main body;
   a reflective plate made of metal and configured to control the light from said LED unit to be an intended distribution, said reflective plate being held by said main body;
   a lighting device configured to light said LED unit, said lighting device being replaceably attached to said main body; and
   a heat radiation block to which said LED unit being replaceably attached and configured to dissipate the heat generated in said LED unit, said heat radiation block being arranged at the other surface side in the thickness direction of said LED unit,
   wherein
   said reflective plate has an installation portion for installing said LED unit,
   said heat radiation block is held by said reflective plate,
   said LED unit has a flat portion at its light extracting surface from said lighting unit, and
   said flat portion is in the same plane with a surrounding area of said installation portion in a reflective surface of said reflective plate.

2. The lighting apparatus as set forth in claim 1, wherein said reflective plate has said installation portion for installing said LED unit, said installation portion being formed to be opened in a shape corresponding to the outer circumference shape of said LED unit.

3. The lighting apparatus as set forth in claim 1, wherein
   said lighting apparatus is configured so that said LED unit is detachably attached to said heat radiation block under the condition that said reflective plate is attached to said main body, and
   said the other surface of said LED unit surface-contacts with said heat radiation block.

4. The lighting apparatus as set in claim 1, wherein said heat radiation block has a plane size larger than that of said LED unit.

5. The lighting apparatus as set forth in claim 1, further comprises a light transmissive cover having a gutter shape, said light transmissive cover being configured to be detachably attached to said reflective plate so as to cover said LED unit and said surrounding area of said installation portion in said reflective plate.

6. The lighting apparatus as set forth in claim 5, wherein said light transmissive cover has light diffusion property of diffusing the light emitted from said LED unit.

7. The lighting apparatus as set forth in claim 1, wherein said LED unit is composed of a plurality of LED modules, each of said LED modules being provided with the same number of said lighting units, said LED modules being formed in the same size with each other, said LED modules being arranged side by side in the longitudinal direction of said installation portion.

8. The lighting apparatus as set forth in claim 1, wherein
   said LED unit comprises a circuit board, said circuit board being provided on one surface thereof with a circuit pattern which defines the relation of connection between said lighting units, said one surface being the opposite side with respect to said heat radiation block, said circuit board being provided with a plurality of opening windows for installing respective said lighting unit, said opening window being formed penetratingly in the thickness direction of said circuit board,
   said circuit board is provided on said one surface with a mirror for reflecting the light emitted from said lighting units, and
   the surface of said mirror is in the same plane with said flat portion.

9. The lighting apparatus as set forth in claim 1, wherein said lighting unit comprises:
   said LED chip;
   a mounting substrate having a patterned conductor for feeding said LED chip with electricity on one surface side thereof, said LED chip being mounted on said one surface of said mounting substrate;
   a dome-shaped optical member configured to control the distribution of the light emitted from said LED chip, said optical member being secured to said one surface of said mounting substrate so as to house said LED chip together with said mounting substrate;
   a sealing member formed of light transmissive sealing material, said sealing member being filled in a space confined between said optical member and said mounting substrate so as to seal therewith said LED chip; and a dome-shaped color conversion member made of light transmissive material with phosphor, said phosphor being excited by the light which is emitted from said LED chip and then travels through said sealing member and said optical member so as to emit the light of a color different from the emission color of said LED chip, said color conversion member being disposed on said one surface of said mounting substrate so as to form an air layer being interposed between said optical member and said color conversion member.

10. The lighting apparatus as set forth in claim 9, wherein said mounting substrate comprises: a heat conducting plate formed of a heat conductive material, said LED chip being mounted on a mounting surface of said heat conducting plate through a sub-mount member; and a printed circuit plate provided with said patterned conductor, said printed circuit plate being fixed on said mounting surface side of said heat conducting plate, said printed circuit plate being formed with an exposure opening for exposing said sub-mount member, said exposure opening being formed penetratingly in the thickness direction of said printed circuit plate, said sub-mount member has a larger plain size than said LED chip, and said sub-mount member is provided with a reflective film for reflecting the light, said reflective film being formed so as to surround the overlap region with said LED chip.

11. The lighting apparatus as set forth in claim 1, wherein said reflective plate has a first height, said first height being defined along with the thickness direction of said LED unit, said first height of said reflective plate is set so that said flat portion at the light extracting surface from said lighting unit in said LED unit is in the same plane with said surrounding area of said installation portion in said reflective surface of said reflective plate.

12. The lighting apparatus as set forth in claim 1, wherein said reflective plate has an adjusting piece, said adjusting piece extends from said reflective plate toward said heat radiation block, said adjusting piece extends into the thickness direction of said LED unit, and said adjusting piece has said first height in the thickness direction of said LED unit, thereby the height of said reflective plate is determined by said adjusting piece, and said first height of said adjusting piece is set so that said flat portion at the light extracting surface from said lighting unit in said LED unit is in the same plane with said surrounding area of said installation portion in said reflective surface of said reflective plate.

13. The lighting apparatus as set forth in claim 12, wherein said LED unit has a first thickness in the thickness direction of said LED unit, and said first height and said first thickness are set so that said flat portion at the light extracting surface from said lighting unit in said LED unit is in the same plane with said surrounding area of said installation portion in said reflective surface of said reflective plate.

14. The lighting apparatus as set forth in claim 13, wherein said heat radiation block has a planar surface, said reflective plate and said LED unit being attached to said planar surface, and said first thickness is set to be same with said first height.

15. The lighting apparatus as set forth in claim 1, wherein said lighting unit comprises: said LED chip; a mounting substrate on which said LED chip is mounted on one surface thereof; and an optical component secured to said one surface of said mounting substrate so as to house said LED chip therein together with said mounting substrate, said optical component has an outer peripheral edge, said outer peripheral edge of said optical component is secured to said one surface of said mounting substrate, and said flat portion at the light extracting surface is defined as the area outside than said outer peripheral edge.

16. The lighting apparatus as set forth in claim 1, wherein said lighting apparatus further comprises an attachment means, and said LED unit is attached with respect to said heat radiation block through said attachment means.

17. The lighting apparatus as set forth in claim 1, wherein said lighting apparatus further comprises an attachment means, and said LED unit is made contact with said reflective plate through said attachment means.

\* \* \* \* \*